(12) United States Patent
Choi et al.

(10) Patent No.: US 12,293,998 B2
(45) Date of Patent: May 6, 2025

(54) DISPLAY DEVICE

(71) Applicant: Samsung Display Co., LTD., Yongin-si (KR)

(72) Inventors: Jin Woo Choi, Yongin-si (KR); Byung Choon Yang, Yongin-si (KR); Min Woo Kim, Yongin-si (KR); Sung Kook Park, Yongin-si (KR); Hyung Il Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 536 days.

(21) Appl. No.: 17/553,680

(22) Filed: Dec. 16, 2021

(65) Prior Publication Data
US 2022/0352131 A1    Nov. 3, 2022

(30) Foreign Application Priority Data
Apr. 30, 2021   (KR) .......................... 10-2021-0056924

(51) Int. Cl.
| | | |
|---|---|---|
| *H01L 25/16* | (2023.01) | |
| *H01L 25/075* | (2006.01) | |
| *H01L 27/12* | (2006.01) | |
| *H01L 27/15* | (2006.01) | |
| *H01L 33/00* | (2010.01) | |

(Continued)

(52) U.S. Cl.
CPC ........ *H01L 25/167* (2013.01); *H01L 33/0095* (2013.01); *H01L 33/20* (2013.01); *H01L 33/505* (2013.01); *H01L 33/007* (2013.01); *H01L 33/0075* (2013.01); *H01L 33/0093* (2020.05); *H01L 2933/0041* (2013.01)

(58) Field of Classification Search
CPC ... H01L 33/0095; H01L 33/20; H01L 33/505; H01L 33/0093; H01L 33/007; H01L 33/0075; H01L 25/167
See application file for complete search history.

(56) References Cited

U.S. PATENT DOCUMENTS

| | | |
|---|---|---|
| 8,476,826 B2 | 7/2013 | Oohata et al. |
| 10,192,858 B2 | 1/2019 | Higginson et al. |

(Continued)

FOREIGN PATENT DOCUMENTS

| | | |
|---|---|---|
| JP | 2010-251360 A | 11/2010 |
| KR | 10-2018-0102424 | 9/2018 |

(Continued)

OTHER PUBLICATIONS

International Search Report issued in PCT/KR2022/001067 dated Apr. 26, 2022, 3 pages.

*Primary Examiner* — Mohsen Ahmadi
(74) *Attorney, Agent, or Firm* — Womble Bond Dickinson (US) LLP

(57) ABSTRACT

A display device may include a plurality of light emitting elements on a substrate and arranged in a matrix form along a first arrangement direction and a second arrangement direction crossing the first arrangement direction, and a first sub pixel area and a second sub pixel area each overlapping at least a portion of the plurality of light emitting elements, spaced from each other in a first direction, and extending in a second direction crossing the first direction. The second direction and the first arrangement direction may be non-parallel to each other.

19 Claims, 22 Drawing Sheets

(51) Int. Cl.
*H01L 33/20* (2010.01)
*H01L 33/44* (2010.01)
*H01L 33/50* (2010.01)
*H01L 33/58* (2010.01)
*H01L 33/62* (2010.01)

(56) References Cited

U.S. PATENT DOCUMENTS

| | | | |
|---|---|---|---|
| 10,818,647 B2 | 10/2020 | Kim et al. | |
| 11,251,337 B2 | 2/2022 | Yoon et al. | |
| 12,218,175 B2 | 2/2025 | Choi et al. | |
| 2004/0263069 A1* | 12/2004 | Yamazaki | G09G 3/30 313/506 |
| 2009/0121983 A1* | 5/2009 | Sung | H10K 59/352 345/76 |
| 2009/0289963 A1* | 11/2009 | Minami | H10K 59/1216 345/84 |
| 2015/0262530 A1* | 9/2015 | Sato | G09G 3/3233 345/83 |
| 2016/0190400 A1* | 6/2016 | Jung | H01L 33/60 438/27 |
| 2018/0033362 A1* | 2/2018 | Yamazaki | G09G 3/3648 |
| 2018/0197924 A1 | 7/2018 | Tada et al. | |
| 2019/0361555 A1* | 11/2019 | Lee | H10K 59/122 |
| 2020/0219856 A1* | 7/2020 | Chang | H01L 25/0753 |
| 2021/0057394 A1 | 2/2021 | Abe | |
| 2021/0142716 A1 | 5/2021 | Robin et al. | |
| 2021/0288033 A1 | 9/2021 | Lim et al. | |
| 2022/0115470 A1 | 4/2022 | Kim et al. | |
| 2022/0199725 A1 | 6/2022 | Choi et al. | |
| 2022/0199947 A1* | 6/2022 | Okabe | H05B 33/22 |
| 2022/0392947 A1 | 12/2022 | Oh et al. | |
| 2023/0027490 A1* | 1/2023 | Kang | H01L 25/16 |

FOREIGN PATENT DOCUMENTS

| | | |
|---|---|---|
| KR | 10-2019-0070633 | 6/2019 |
| KR | 10-2020-0006208 | 1/2020 |
| KR | 10-2020-0026285 | 3/2020 |
| KR | 10-2020-0034896 A | 4/2020 |
| KR | 10-2020-0056213 | 5/2020 |
| KR | 10-2021-0028795 A | 3/2021 |
| KR | 10-2022-0087669 | 6/2022 |
| WO | WO 2020/071600 A1 | 4/2020 |
| WO | WO 2020/080603 A1 | 4/2020 |

* cited by examiner

DISPLAY DEVICE

CROSS-REFERENCE TO RELATED APPLICATION

This application claims priority to and the benefit of Korean Patent Application No. 10-2021-0056924 filed on Apr. 30, 2021 in the Korean Intellectual Property Office (KIPO), the entire content of which is incorporated by reference herein.

BACKGROUND

1. Field

The present disclosure generally relates to a display device.

2. Description of the Related Art

In recent years, as interest in information display is increasing, research and development for a display device are continuously being conducted.

SUMMARY

Aspects of one or more embodiments of the present disclosure are directed toward a display device and a method of manufacturing the same, in which a ratio of light emitting elements capable of a normal operation is increased, thereby improving disposition efficiency of the light emitting elements.

Aspects of one or more embodiments of the present disclosure are directed toward a display device and a method of manufacturing the same, in which predictability of a process is improved.

Aspects of one or more embodiments of the present disclosure are not limited to the above-described aspects, and other technical aspects that are not described will be clearly understood by those skilled in the art from the following description.

According to one or more embodiments of the present disclosure, a display device may include a plurality of light emitting elements on a substrate and arranged in a matrix form along a first arrangement direction and a second arrangement direction crossing the first arrangement direction, and a first sub pixel area and a second sub pixel area each overlapping at least a portion of the plurality of light emitting elements, spaced from each other in a first direction, and extending in a second direction crossing the first direction. The second direction and the first arrangement direction may be non-parallel to each other.

According to one or more embodiments, the display device may further include a light blocking layer on the substrate and defining the first sub pixel area and the second sub pixel area.

According to one or more embodiments, light of a first color may be emitted in the first sub pixel area, and light of a second color may be emitted in the second sub pixel area.

According to one or more embodiments, the second direction and the first arrangement direction may form a gap angle having an acute angle.

According to one or more embodiments, the gap angle may be 5 degrees to 40 degrees.

According to one or more embodiments, the first sub pixel area may include a side parallel to the first direction and having a first length, the plurality of light emitting elements may include a first light emitting element and a second light emitting element, the first light emitting element and the second light emitting element being adjacent to each other in the first arrangement direction and spaced from each other by a first arrangement distance, and the first length and the first arrangement distance may satisfy $$y \le \frac{x_1}{\sqrt{2}}$$

where $x_1$ is the first length, and y is the first arrangement distance.

According to one or more embodiments, the first arrangement distance may be a shortest distance between the first light emitting element and the second light emitting element.

According to one or more embodiments, the display device may further include a third sub pixel area spaced from the first sub pixel area and the second sub pixel area along the first direction. The first sub pixel area may be at a side of the second sub pixel area, the third sub pixel area may be at another side of the second sub pixel area, an end portion of the first sub pixel area and another end portion of the third sub pixel area may be spaced from each other by a second length, the plurality of light emitting elements may include a first light emitting element and a second light emitting element, the first light emitting element and the second light emitting element being adjacent to each other in the first arrangement direction and spaced from each other by a first arrangement distance, and the second length and the first arrangement distance may satisfy $$y \le \frac{x_2/3}{\sqrt{2}}$$

where $x_2$ is the second length, and y is the first arrangement distance.

According to one or more embodiments, the first sub pixel area and the second sub pixel area may be spaced from each other by a separation distance (e.g., a predetermined separation distance), each of the plurality of light emitting elements may have a bottom length (e.g., a predetermined bottom length), and the separation distance and the bottom length may satisfy $$z \ge w * \sqrt{2}$$

where z is the separation distance, and w is the bottom length.

According to one or more embodiments, a bottom surface of the plurality of light emitting elements may have a circular shape, and the bottom length may be a diameter of a circle.

According to one or more embodiments, a bottom surface of the plurality of light emitting elements may have a rectangular shape, and the bottom length may be a diagonal length of a rectangle.

According to one or more embodiments, the display device may further include a light control part on the plurality of light emitting elements and configured to change a wavelength of light emitted from the light emitting elements, and a third sub pixel area spaced from the first sub pixel area and the second sub pixel area along the first direction, and extending in the second direction. The light control part may include a first wavelength conversion pattern overlapping the first sub pixel area, a second wavelength conversion pattern overlapping the second sub pixel area, and a light transmission pattern overlapping the third sub pixel area.

According to one or more embodiments, at least a first portion of the plurality of light emitting elements may overlap the first sub pixel area, a second portion of the plurality of light emitting elements may overlap the second sub pixel area, and a third portion of the plurality of light emitting elements may overlap the third sub pixel area, and the plurality of light emitting elements may emit light of a same color.

According to one or more embodiments, a number per unit area of the plurality of light emitting elements on the substrate may be uniform.

According to one or more embodiments of the present disclosure, a method of manufacturing a display device may include providing a stack substrate, forming a first semiconductor layer, an active layer, and a second semiconductor layer on the stack substrate, providing a plurality of light emitting elements by etching the first semiconductor layer, the active layer, and the second semiconductor layer, separating the stack substrate from the plurality of light emitting elements and combining the plurality of light emitting elements on a donor film, disposing the plurality of light emitting elements on the donor film on a substrate, and disposing a light blocking layer defining a first sub pixel area and a second sub pixel area on the plurality of light emitting elements. Providing the plurality of light emitting elements may include patterning the plurality of light emitting elements in a matrix form along a first arrangement direction and a second arrangement direction crossing the first arrangement direction, disposing the light blocking layer may include forming the light blocking layer so that the first sub pixel area and the second sub pixel area are spaced from each other in a first direction and each of the first sub pixel area and the second sub pixel area extends in a second direction crossing the first direction, and the second direction and the first arrangement direction may be non-parallel to each other.

According to one or more embodiments, the method may further include deforming the donor film so that a separation distance between the plurality of light emitting elements is increased.

According to one or more embodiments, before deforming the donor film is performed, the plurality of light emitting elements may be spaced from each other at an undeformed distance, and in deforming the donor film, the separation distance between the plurality of light emitting elements may be increased, the plurality of light emitting elements adjacent in the first arrangement direction may be separated by a first arrangement distance, and the plurality of light emitting elements adjacent in the second arrangement direction may be separated by a second arrangement distance.

According to one or more embodiments, an expandable range may be a multiple of a length within a limit that is non-destructive when the donor film is expanded in one direction, and the expandable range of the donor film satisfies $$A \geq \frac{y}{v}$$

where A is the expandable range of the donor film, y is the first arrangement distance, and v is the undeformed distance.

According to one or more embodiments, the second direction and the first arrangement direction may form a gap angle having an acute angle.

According to one or more embodiments, the method may further include forming a first wavelength conversion pattern, a second wavelength conversion pattern, and a light transmission pattern at a same layer as the light blocking layer, disposing the light blocking layer may include forming the light blocking layer so that a third sub pixel area spaced from the first sub pixel area and the second sub pixel area in the first direction and extending in the second direction is defined, the plurality of light emitting elements may emit light of a third color, the first wavelength conversion pattern may change the light of the third color to light of a first color, the second wavelength conversion pattern may change the light of the third color to light of a second color, the light transmission pattern may transmit the light of the third color, the plurality of light emitting elements may include first light emitting elements overlapping the first sub pixel area and the first wavelength conversion pattern, second light emitting elements overlapping the second sub pixel area and the second wavelength conversion pattern, and third light emitting elements overlapping the third sub pixel area and the light transmission pattern.

Aspects and methods of one or more embodiments of the present disclosure are not limited to the above-described aspects and methods, and aspects and methods which are not described will be clearly understood by those skilled in the art from the present specification and the accompanying drawings.

Aspects of one or more embodiments of the present disclosure are directed toward a display device and a method of manufacturing the same, in which a ratio of light emitting elements capable of a normal operation is increased, thereby improving disposition efficiency of the light emitting elements may be provided.

Aspects of one or more embodiments of the present disclosure are directed toward a display device and a method of manufacturing the same, in which predictability of a process is improved, may be provided.

Effects and aspects of the present disclosure are not limited to the above-described effects, and effects and aspects that are not described will be clearly understood by those skilled in the art from the present specification and the accompanying drawings.

BRIEF DESCRIPTION OF THE DRAWINGS

The above and other aspects and features of the present disclosure will become more apparent by describing in further detail embodiments thereof with reference to the accompanying drawings, in which.

DETAILED DESCRIPTION

Figure 1:
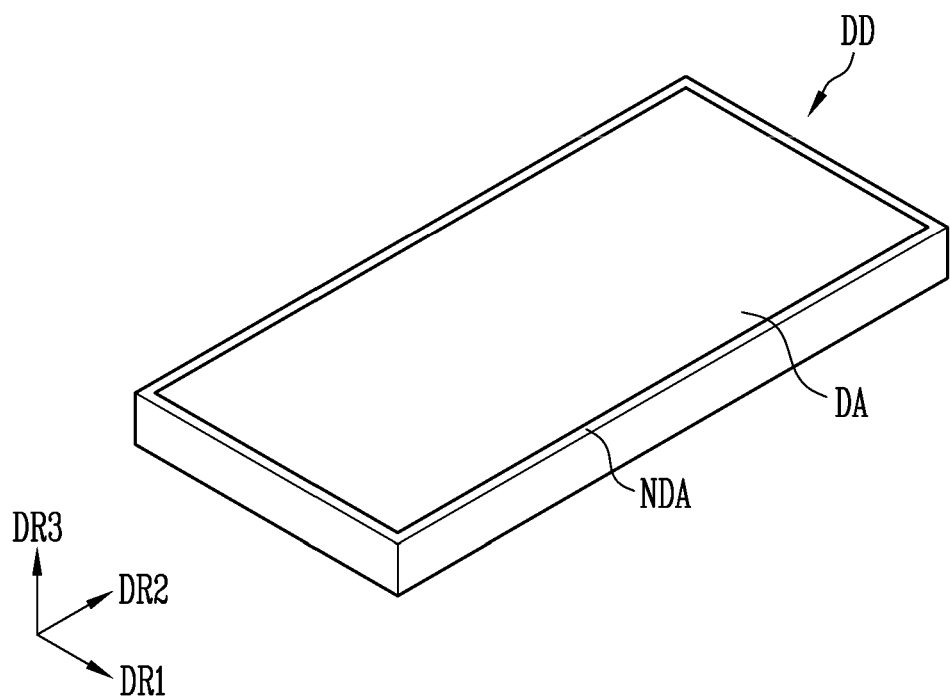
FIG. 1 is a perspective view schematically illustrating a display device according to one or more embodiments.

Because the embodiment described in the present specification is for clearly describing the spirit of the present disclosure to those skilled in the art to which the present disclosure pertains, the present disclosure is not limited by the embodiment described in the present specification, and the scope of the present disclosure should be interpreted as including modifications or variations that do not depart from the spirit of the present disclosure.

The present disclosure will now be described more fully with reference to the accompanying drawings in which embodiments of the disclosure are shown. Like reference numerals in the drawings denote like elements throughout, and duplicative descriptions thereof may not be provided.

The terminology used herein is for the purpose of describing particular embodiments only and is not intended to limit the embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

The present disclosure relates to a display device. Hereinafter, a display device according to one or more embodiments is described with reference to FIGS. 1 to 22.

Figure 2:
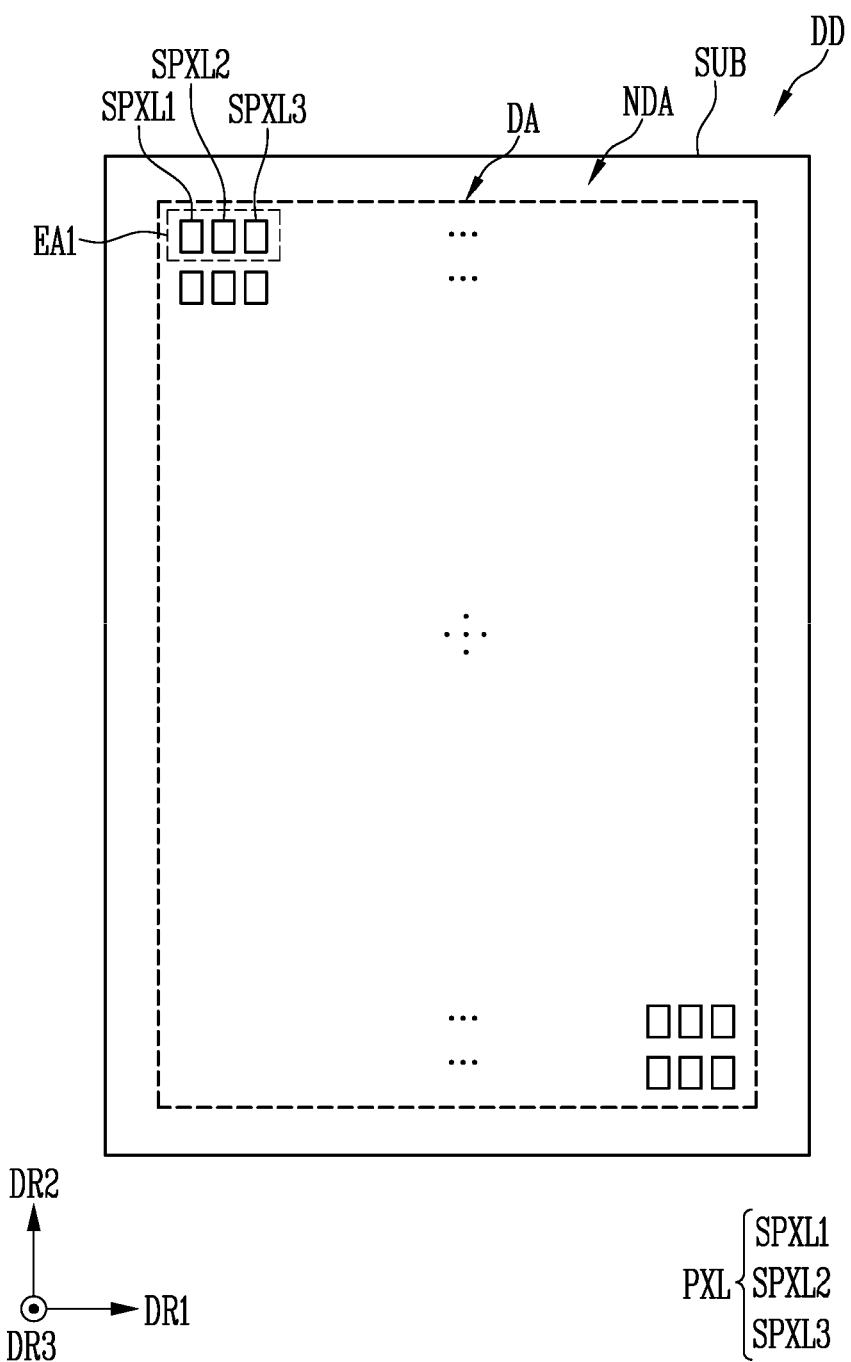
FIG. 2 is a plan view schematically illustrating a display device according to one or more embodiments.

FIG. 1 is a perspective view schematically illustrating a display device according to one or more embodiments. FIG. 2 is a plan view schematically illustrating a display device according to one or more embodiments.

Referring to FIGS. 1 and 2, the display device DD according to one or more embodiments may be configured to emit light.

According to one or more embodiments, the display device DD may include a substrate SUB and a pixel PXL disposed on the substrate SUB. In one or more embodiments, the display device DD may further include a driving circuit unit (e.g., a scan driver and a data driver) for driving the pixel PXL, lines, and pads.

According to an example, the pixel PXL may include a first sub pixel SPXL1, a second sub pixel SPXL2, and a third sub pixel SPXL3.

The display device DD may include a display area DA and a non-display area NDA. The non-display area NDA may refer to an area other than the display area DA. The non-display area NDA may be around (e.g., surround) at least a portion of the display area DA.

The substrate SUB may configure a base member of the display device DD. The substrate SUB may be a rigid substrate or a flexible substrate or film, but is not limited to a specific example.

The display area DA may refer to an area in which the pixel PXL is disposed. The non-display area NDA may refer to an area in which the pixel PXL is not disposed. In the non-display area NDA, the driving circuit unit, the lines, and the pads connected to the pixel PXL of the display area DA may be disposed.

According to an example, the pixel PXL may be arranged according to a stripe or a PENTILE® (PENTILE® is a registered trademark of Samsung Display Co., Ltd., Republic of Korea) arrangement structure (e.g., an RGBG arrangement structure), but the present disclosure is not limited thereto, and any suitable changes may be applied.

According to one or more embodiments, the pixel PXL including a plurality of sub pixels (e.g. see 'SPXL' of FIG. 4) may be disposed in the display area DA. For example, in the display area DA, a first sub pixel SPXL1 emitting light of a first color, a second sub pixel SPXL2 emitting light of a second color, and a third sub pixel SPXL3 emitting light of a third color may be arranged, and at least one of the first to third sub pixels SPXL1, SPXL2, and SPXL3 may configure or form a pixel unit or pixel PXL capable of emitting light of various suitable colors.

For example, each of the first to third sub pixels SPXL1, SPXL2, and SPXL3 may be a sub pixel emitting light of a color (e.g., a predetermined color). For example, the first sub pixel SPXL1 may be a red pixel emitting red (e.g., a first color) light, the second sub pixel SPXL2 may be a green pixel emitting green (e.g., a second color) light, and the third sub pixel SPXL3 may be a blue pixel emitting blue (e.g., a third color) light. However, the color, the type, the number, and/or the like of the sub pixels SPXL configuring or forming each pixel unit or pixel PXL are/is not limited to a specific example.

Hereinafter, for convenience of description, one or more embodiments in which the pixel PXL includes the first to third sub pixels SPXL1, SPXL2, and SPXL3 is described. A sub pixel SPXL defined in the present specification may be any one of the first to third sub pixels SPXL1, SPXL2, and SPXL3.

Figure 3:
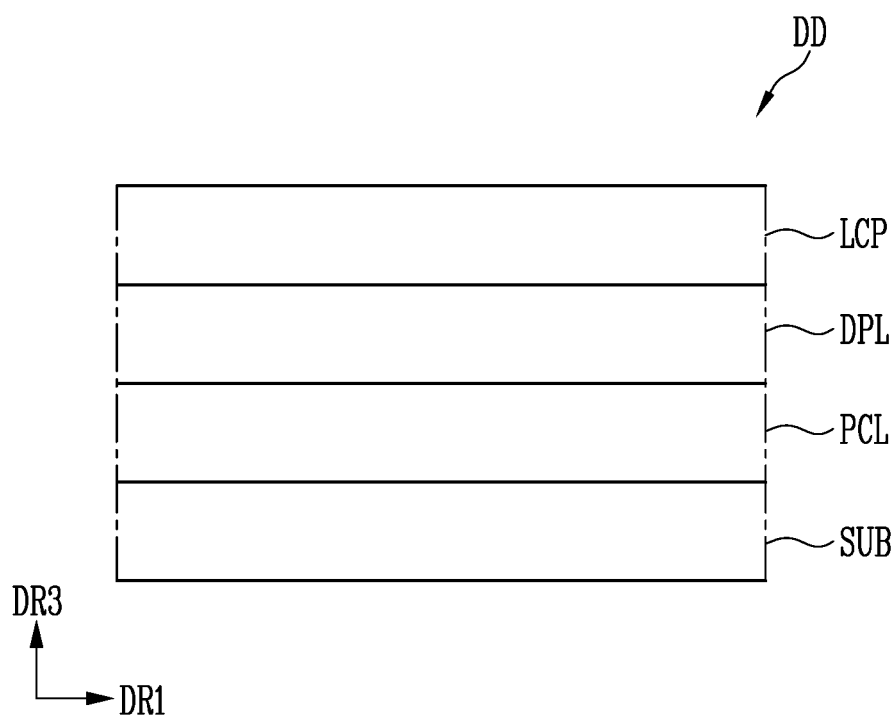
FIG. 3 is a cross-sectional view illustrating a display device according to one or more embodiments.

FIG. 3 is a cross-sectional view illustrating a display device according to one or more embodiments.

The display device DD may include the substrate SUB, a pixel circuit part PCL, a display element part DPL, and a light control part LCP. According to an example, the substrate SUB, the pixel circuit part PCL, the display element part DPL, and the light control part LCP may be stacked (e.g., sequentially stacked) according to a display direction (e.g., a third direction DR3) of the display device DD. Here, the display direction may refer to a thickness direction of the substrate SUB.

The substrate SUB may configure a base surface of the display device DD. An individual configuration of the display device DD may be disposed on the substrate SUB.

The pixel circuit part PCL may be disposed on the substrate SUB. The pixel circuit part PCL may include a pixel circuit (e.g. see 'PXC' of FIG. 4) configured to drive the pixel PXL.

The display element part DPL may be disposed on the pixel circuit part PCL. The display element part DPL may emit light based on an electrical signal provided from the pixel circuit part PCL. The display element part DPL may include a light emitting element (e.g. see 'LD' of FIG. 4) capable of emitting light. The light emitted from the display element part DPL may pass through the light control part LCP and may be provided to an outside (e.g., an area outside the display device DD).

Figure 5:
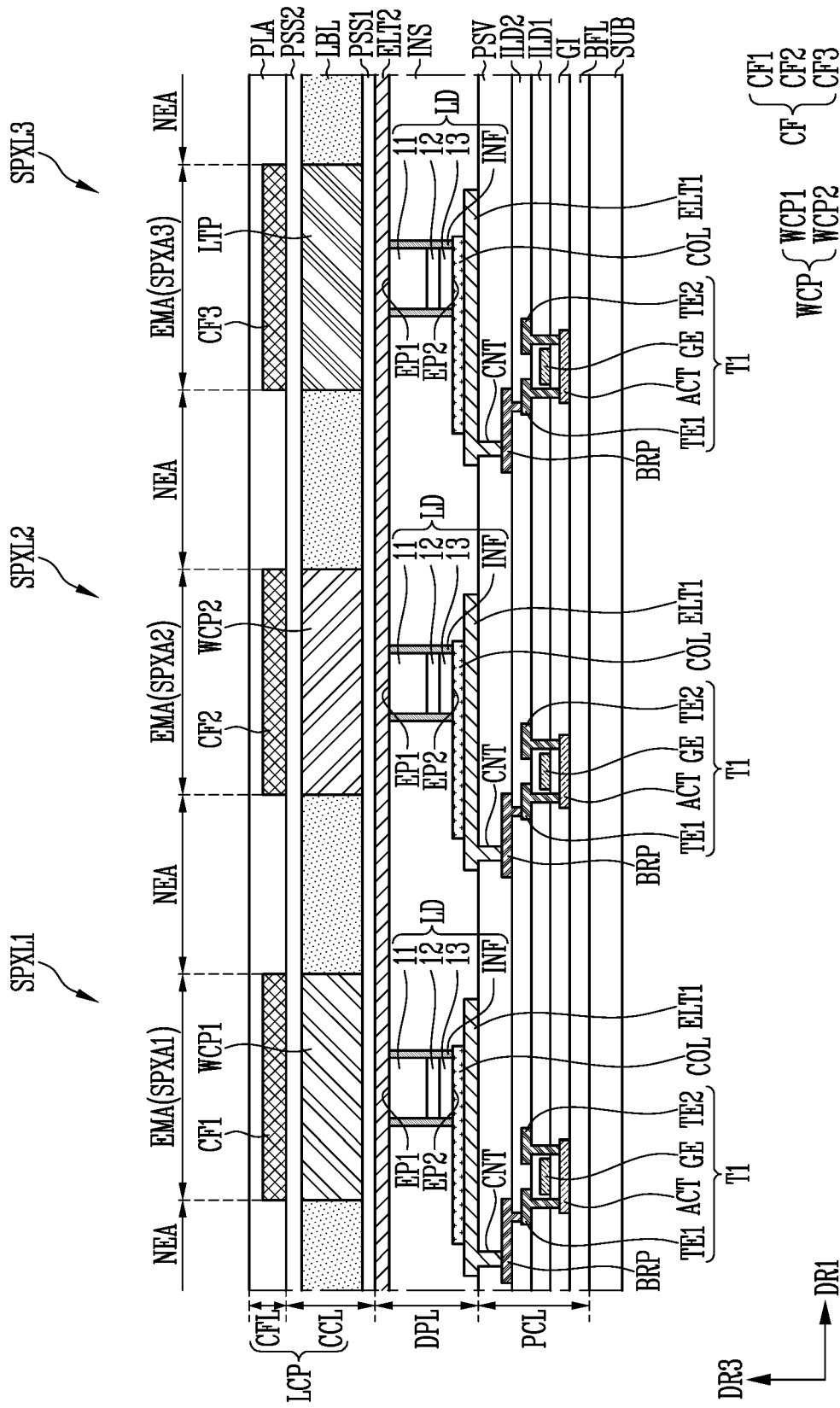
FIG. 5 is a cross-sectional view schematically illustrating a pixel according to one or more embodiments.

The light control part LCP may be disposed on the display element part DPL. The light control part LCP may be disposed on the light emitting elements LD. The light control part LCP may change a wavelength of the light provided from the display element part DPL (or the light emitting elements LD). According to an example, as shown in FIG. 5, the light control part LCP may include a color conversion part CCL configured to change the wavelength of the light and a color filter part CFL that transmits light of a specific wavelength.

Figure 4:
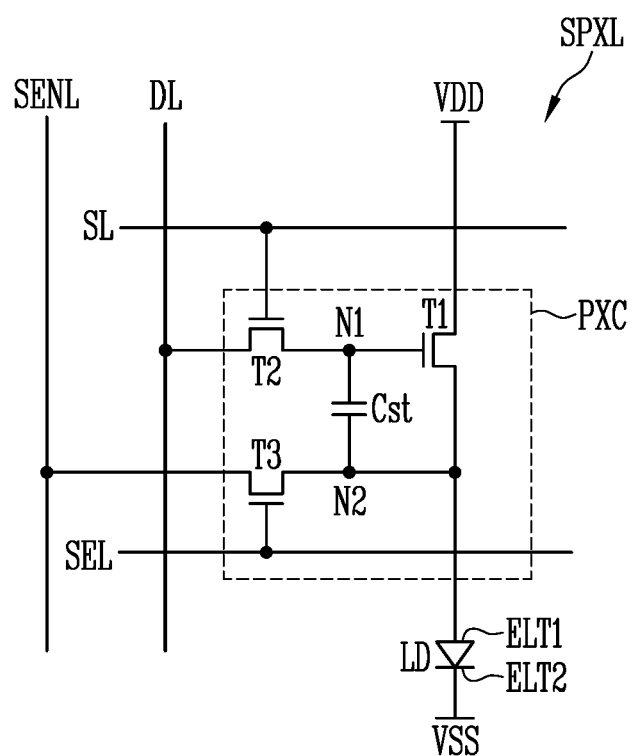
FIG. 4 is a diagram illustrating a pixel circuit included in a sub pixel according to one or more embodiments.

FIG. 4 is a diagram illustrating a pixel circuit included in a sub pixel according to one or more embodiments.

FIG. 4 shows an electrical connection relationship between components included in a sub pixel SPXL applied to a display device (e.g., an active display device) DD according to one or more embodiments. Although FIG. 4 shows a type of components included in the sub pixel SPXL, a type of the components included in the sub pixel SPXL is not limited thereto.

Referring to FIG. 4, the sub pixel SPXL may include the light emitting element LD and the pixel circuit PXC.

The light emitting element LD may be connected between a first power line VDD and a second power line VSS. An end portion (e.g., a P-type semiconductor) of the light emitting element LD may be connected to the first power line VDD via a first electrode ELT1 and the pixel circuit PXC, and another end portion (e.g., an N-type semiconductor) of the light emitting element LD may be connected to the second power line VSS via a second electrode ELT2.

According to one or more embodiments, when a driving current is supplied through the pixel circuit PXC, the light emitting element LD may emit light of a luminance corresponding to the driving current.

According to one or more embodiments, the light emitting elements LD may be connected to each other through various suitable connection structures between the first power line VDD and the second power line VSS. For example, the light emitting elements LD may be connected to each other only in parallel or may be connected to each other only in series. Alternatively, the light emitting elements LD may be connected in a series/parallel mixed structure. For example, a first plurality of the light emitting elements LD may be connected to each other in series and a second plurality of the light emitting elements LD may be connected to each other in parallel.

The first power line VDD and the second power line VSS may have different potentials from each other so that the light emitting elements LD may emit light. The first power line VDD and the second power line VSS may have a potential difference of a level at which light may be emitted during an emission period of the sub pixel SPXL. For example, the first power line VDD may be set to a potential higher than a potential of the second power line VSS.

The pixel circuit PXC may connect between the first power line VDD and the light emitting element LD. The pixel circuit PXC may include a first transistor T1, a second transistor T2, a third transistor T3, and a storage capacitor Cst.

According to one or more embodiments, an electrode of the first transistor T1 may be connected to the first power line VDD, and another electrode may be connected to one electrode (e.g., an anode electrode) of the light emitting element LD. A gate electrode of the first transistor T1 may be connected to a first node N1. The first transistor T1 may control a current flowing through the light emitting element LD in response to a voltage applied through the first node N1.

According to one or more embodiments, an electrode of the second transistor T2 may be connected to a data line DL, and another electrode may be connected to the first node N1. A gate electrode of the second transistor T2 may be connected to a scan line SL. When a scan signal is supplied from the scan line SL, the second transistor T2 may be turned on, and at this time, the second transistor T2 may transmit the data signal provided from the data line DL to the first node N1.

According to one or more embodiments, an electrode of the third transistor T3 may be connected to a sensing line SENL, and another electrode may be connected to a second node N2. A gate electrode of the third transistor T3 may be connected to a sensing signal line SEL. When the third transistor T3 is turned on in response to a sensing signal provided from the sensing signal line SEL, a reference voltage may be provided to the second node N2 through the sensing line SENL.

According to one or more embodiments, the reference voltage may set or initialize a voltage of an electrode of the first transistor T1 connected to the light emitting element LD (e.g., a source electrode of the first transistor T1) to a constant value. According to an example, the reference voltage may be set to be less than or equal to a voltage of the second power line VSS.

According to one or more embodiments, when the third transistor T3 is turned on in response to the sensing signal provided from the sensing signal line SEL, the third transistor T3 may transmit a sensing current to the sensing line SENL.

According to one or more embodiments, the sensing current may be used to calculate a mobility and a change amount of a threshold voltage of the first transistor T1.

The storage capacitor Cst may be connected between the first node N1 (or the gate electrode of the first transistor T1) and the second node N2 (or another electrode of the first transistor T1). The storage capacitor Cst may store information on a difference between a voltage of the first node N1 and a voltage of the second node N2.

Meanwhile, a structure of the pixel circuit PXC is not limited to the structure shown in FIG. 4, and various suitable types of structures may be implemented. In addition, in FIG. 4, the first to third transistors T1 to T3 are shown based on N-type transistors, but the present disclosure is not limited thereto, and the first to third transistors T1 to T3 may be configured of P-type transistors.

Hereinafter, a structure of the sub pixels SPXL configuring the pixel PXL is described in more detail with reference to FIG. 5. Contents that may be repetitive with respect to the above-described contents are briefly described or not repeated.

FIG. 5 is a cross-sectional view schematically illustrating a pixel according to one or more embodiments.

FIG. 5 shows the first sub pixel SPXL1, the second sub pixel SPXL2, and the third sub pixel SPXL3.

In FIG. 5, the description is given based on the first transistor T1 among the configurations included in the pixel circuit PXC described with reference to FIG. 4. For example, one or more embodiments in which the first transistor T1 is provided in each of the first sub pixel SPXL1, the second sub pixel SPXL2, and the third sub pixel SPXL3 is shown in FIG. 5.

The pixel circuit part PCL may be disposed on the substrate SUB. The pixel circuit part PCL may include a buffer layer BFL, the first transistor T1, a gate insulating layer GI, a first interlayer insulating layer ILD1, a second interlayer insulating layer ILD2, a bridge pattern BRP, a contact portion CNT, and a protective layer PSV.

According to an example, individual configurations of the pixel circuit part PCL may be defined in each of the first to third sub pixels SPXL1, SPXL2, and SPXL3.

The buffer layer BFL may be disposed on the substrate SUB. The buffer layer BFL may prevent or substantially prevent an impurity from being diffused from an outside. The buffer layer BFL may include at least one of metal oxides such as silicon nitride ($SiN_x$), silicon oxide ($SiO_x$), silicon oxynitride ($SiO_xN_y$), and aluminum oxide ($AlO_x$).

According to one or more embodiments, the first transistor T1 may be a thin film transistor. According to one or more embodiments, the first transistor T1 may be a driving transistor.

The first transistor T1 may be connected (e.g., electrically connected) to the light emitting element LD. For example, the first transistor T1 of the first sub pixel SPXL1 may be connected (e.g., electrically connected) to the light emitting element LD disposed in a first sub pixel area SPXA1. The first transistor T1 of the second sub pixel SPXL2 may be connected (e.g., electrically connected) to the light emitting element LD disposed in a second sub pixel area SPXA2. The first transistor T1 of the third sub pixel SPXL3 may be connected (e.g., electrically connected) to the light emitting element LD disposed in a third sub pixel area SPXA3.

According to one or more embodiments, the first transistor T1 may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include at least one of polysilicon, amorphous silicon, and oxide semiconductor.

According to one or more embodiments, the active layer ACT may include a first contact region that is in contact with the first transistor electrode TE1 and a second contact region that is in contact with the second transistor electrode TE2. The first contact region and the second contact region may be a semiconductor pattern doped with an impurity. A region between the first contact region and the second contact region may be a channel region. The channel region may be an intrinsic semiconductor pattern that is not doped with an impurity.

The gate electrode GE may be disposed on the gate insulating layer GI. A position of the gate electrode GE may correspond to a position of the channel region of the active layer ACT. For example, the gate electrode GE may be disposed on the channel region of the active layer ACT with the gate insulating layer GI interposed therebetween.

The gate insulating layer GI may be disposed on the active layer ACT. The gate insulating layer GI may include an inorganic material. According to an example, the gate insulating layer GI may include at least one of silicon nitride ($SiN_x$), silicon oxide ($SiO_x$), silicon oxynitride ($SiO_xN_y$), and aluminum oxide ($AlO_x$). According to one or more embodiments, the gate insulating layer GI may include an organic material.

The first interlayer insulating layer ILD1 may be positioned on the gate electrode GE. Similar to the gate insulating layer GI, the first interlayer insulating layer ILD1 may include at least one of silicon nitride ($SiN_x$), silicon oxide ($SiO_x$), silicon oxynitride ($SiO_xN_y$), and aluminum oxide ($AlO_x$).

The first transistor electrode TE1 and the second transistor electrode TE2 may be positioned on the first interlayer insulating layer ILD1. The first transistor electrode TE1 may pass through the gate insulating layer GI and the first interlayer insulating layer ILD1 and may be in contact with the first contact region of the active layer ACT, and the second transistor electrode TE2 may pass through the gate insulating layer GI and the first interlayer insulating layer ILD1 and may be in contact with the second contact region of the active layer ACT. According to an example, the first transistor electrode TE1 may be a source electrode, and the second transistor electrode TE2 may be a drain electrode, but the present disclosure is not limited thereto.

The second interlayer insulating layer ILD2 may be positioned on the first transistor electrode TE1 and the second transistor electrode TE2. Similar to the first interlayer insulating layer ILD1 and the gate insulating layer GI, the second interlayer insulating layer ILD2 may include an inorganic material. Examples of the inorganic material of the second interlayer insulating layer ILD2 may include at least one of the materials of the first interlayer insulating layer ILD1 and the gate insulating layer GI, for example, silicon nitride ($SiN_x$), silicon oxide ($SiO_x$), silicon oxynitride ($SiO_xN_y$), and aluminum oxide ($AlO_x$). However, the present disclosure is not limited thereto. According to one or more embodiments, the second interlayer insulating layer ILD2 may include an organic material.

The bridge pattern BRP may be disposed on the second interlayer insulating layer ILD2. The bridge pattern BRP may be connected to the first transistor electrode TE1 through a contact hole passing through the second interlayer insulating layer ILD2.

The protective layer PSV may be positioned on the second interlayer insulating layer ILD2. The protective layer PSV may cover the bridge pattern BRP. The protective layer PSV may be provided in a form including an organic insulating layer, an inorganic insulating layer, or the organic insulating layer disposed on the inorganic insulating layer, but is not limited thereto. According to one or more embodiments, the contact portion CNT connected to a region of the bridge pattern BRP may be formed in or through the protective layer PSV.

The display element part DPL may be disposed on the pixel circuit part PCL.

The display element part DPL may include a first electrode ELT1, a connection electrode COL, an insulating layer INS, the light emitting element LD, and a second electrode ELT2. According to an example, individual configurations of the display element part DPL may be defined in each of the first to third sub pixels SPXL1, SPXL2, and SPXL3.

The first electrode ELT1 may be disposed on the protective layer PSV. The first electrode ELT1 may be disposed under the light emitting element LD. The first electrode ELT1 may be connected to the bridge pattern BRP through the contact portion CNT.

According to one or more embodiments, the first electrode ELT1 may be connected (e.g., electrically connected) to the light emitting element LD. According to an example, the first electrode ELT1 may provide an electrical signal provided from the first transistor T1 to the light emitting element LD. The first electrode ELT1 may apply an anode signal to the light emitting element LD.

According to one or more embodiments, the first electrode ELT1 may include a conductive material. For example, the first electrode ELT1 may include a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the first electrode ELT1 is not limited to the above-described example.

The connection electrode COL may be disposed on the first electrode ELT1. For example, a surface of the connection electrode COL may be connected to the light emitting element LD, and another surface of the connection electrode COL may be connected to the first electrode ELT1.

The connection electrode COL may include a conductive material and may connect (e.g., electrically connect) the first electrode ELT1 and the light emitting element LD. For example, the connection electrode COL may be connected (e.g., electrically connected) to a second semiconductor layer 13 of the light emitting element LD. According to one or more embodiments, the connection electrode COL may include a conductive material having a reflective property to reflect light emitted from the light emitting element LD, thereby improving light emission efficiency of the pixel PXL.

According to one or more embodiments, the connection electrode COL may be a bonding metal that is bonding-combined or bonded to the light emitting element LD. The connection electrode COL may be bonding-combined or bonded to the light emitting element LD.

The light emitting element LD may be included in each of the first to third sub pixels SPXL1, SPXL2, and SPXL3. The light emitting element LD is configured to emit light. The light emitting element LD may include a first semiconductor layer 11, the second semiconductor layer 13, and an active layer 12 interposed between the first semiconductor layer 11 and the second semiconductor layer 13. For example, when an extension direction of the light emitting element LD is a length direction, the light emitting element LD may include the first semiconductor layer 11, the active layer 12, and the second semiconductor layer 13 stacked (e.g., sequentially stacked) along the length direction.

According to one or more embodiments, the light emitting element LD may be provided in a column shape extending along one direction. The light emitting element LD may have a first end portion EP1 and a second end portion EP2. One of the first semiconductor layer 11 and the second semiconductor layer 13 may be adjacent to the first end portion EP1 of the light emitting element LD. The other one of the first semiconductor layer 11 and the second semiconductor layer 13 may be adjacent to the second end portion EP2 of the light emitting element LD.

According to one or more embodiments, the light emitting element LD may be a light emitting element manufactured in a column shape through an etching method or the like. In the present specification, the term "column shape" encompasses a rod-like shape or a bar-like shape that is long in a length direction (i.e., an aspect ratio is greater than 1), such as a circular column or a polygonal column, and a shape of a cross section is not particularly limited. For example, a length of the light emitting element LD may be greater than a diameter (or a width of the cross section) thereof.

According to one or more embodiments, the light emitting element LD may have a size as small as nano scale to micro scale (nanometer scale to micrometer scale). For example, each of the light emitting elements LD may have a diameter (or width) and/or a length of a nano scale to micro scale range. However, the size of the light emitting element LD is not limited thereto.

The first semiconductor layer 11 may be a first conductivity type semiconductor layer. For example, the first semiconductor layer 11 may include an N-type semiconductor layer. For example, the first semiconductor layer 11 may include any one semiconductor material among InAlGaN, GaN, AlGaN, InGaN, AlN, and InN, and may include an N-type semiconductor layer doped with a first conductivity type dopant such as Si, Ge, and Sn. However, the material configuring the first semiconductor layer 11 is not limited thereto.

The active layer 12 may be disposed on the first semiconductor layer 11 and may be formed in a single-quantum well structure or a multi-quantum well structure. For example, when the active layer 12 is formed in the multi-quantum well structure, in the active layer 12, a barrier layer, a strain reinforcing layer, and a well layer may be repeatedly stacked periodically as one unit. The strain reinforcing layer may have a lattice constant smaller than a lattice constant of the barrier layer, and thus may further reinforce the structure to protect against a strain, for example, a compression strain, applied to the well layer. However, a structure of the active layer 12 is not limited to the above-described embodiment.

According to one or more embodiments, the active layer 12 may emit light having a wavelength of 400 nm to 900 nm. According to an example, the active layer 12 may include a material such as AlGaN and InAlGaN, but is not limited to the above-described example.

The second semiconductor layer 13 may be disposed on the active layer 12 and may include a semiconductor layer of a type different from that of the first semiconductor layer 11. For example, the second semiconductor layer 13 may include a P-type semiconductor layer. For example, the second semiconductor layer 13 may include at least one semiconductor material among InAlGaN, GaN, AlGaN, InGaN, AlN, and InN, and may include a P-type semiconductor layer doped with a second conductivity type dopant such as Mg. However, the material configuring the second semiconductor layer 13 is not limited thereto, and various other suitable materials may configure the second semiconductor layer 13.

When a voltage greater than or equal to a threshold voltage is applied to both ends of the light emitting element LD, electron-hole pairs are combined in the active layer 12, and thus the light emitting element LD emits light. By controlling the light emission of the light emitting element LD using this principle, the light emitting element LD may be used as a light source of various light emitting devices including a pixel of a display device.

According to one or more embodiments, the light emitting element LD may further include an insulating film INF provided on a surface. The insulating film INF may be formed of a single film or a double film, but is not limited thereto, and may be formed of a plurality of films. For example, the insulating film INF may include a first insulating film including a first material and a second insulating film including a second material different from the first material.

According to one or more embodiments, the insulating film INF may expose both end portions of the light emitting element LD having different polarities. For example, the insulating film INF may expose an end of each of the first semiconductor layer 11 and the second semiconductor layer 13 positioned at the first end portion EP1 and the second end portion EP2 of the light emitting element LD, respectively.

According to one or more embodiments, the insulating film INF may include an inorganic material. For example, the insulating film INF may be configured of or formed of a single layer or multiple layers by including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but is not limited thereto.

According to one or more embodiments, the insulating film INF may secure electrical stability of the light emitting element LD. In addition, even though a plurality of light emitting elements LD are disposed closely with or near each other, an unwanted short circuit may be prevented from occurring between the light emitting elements LD (e.g., between adjacent light emitting elements LD).

According to one or more embodiments, the light emitting element LD may further include an additional configuration in addition to the above-described configuration. For example, the light emitting element LD may additionally include at least one phosphor layer, active layer, semiconductor layer and/or electrode layer disposed on or at an end side of the first semiconductor layer 11, the active layer 12 and/or the second semiconductor layer 13. For example, a contact electrode layer may be further disposed on each of the first and second end portions EP1 and EP2 of the light emitting element LD.

The insulating layer INS may be disposed on the protective layer PSV. The insulating layer INS may cover at least a portion of the first electrode ELT1 and/or the connection electrode COL. The insulating layer INS may be provided between the light emitting elements LD bonding-combined or bonded to the connection electrode COL. The insulating layer INS may be disposed between the light emitting elements LD, and an outer surface of the light emitting element LD may be covered. According to an example, the insulating layer INS may include any one of materials listed with reference to the insulating film INF, but is not limited thereto.

The second electrode ELT2 may be disposed on the insulating layer INS. The second electrode ELT2 may be disposed on the light emitting element LD.

According to one or more embodiments, the second electrode ELT2 may be connected (e.g., electrically connected) to the light emitting element LD. The second electrode ELT2 may be connected (e.g., electrically connected) to the first semiconductor layer 11. According to an example, the second electrode ELT2 may apply the cathode signal to the light emitting element LD. The second electrode ELT2 may provide an electrical signal supplied from the second power line VSS to the light emitting element LD.

According to one or more embodiments, the second electrode ELT2 may include a conductive material. For example, the second electrode ELT2 may include a transparent conductive material. The second electrode ELT2 may include any one of a conductive oxide such as indium tin oxide (ITO), indium zinc oxide (IZO), zinc oxide (ZnO), indium gallium zinc oxide (IGZO), and indium tin zinc oxide (ITZO), and a conductive polymer such as PEDOT (poly(3,4-ethylenedioxythiophene)). However, the second electrode ELT2 is not limited to the above-described example.

The light control part LCP may be disposed on the display element part DPL. The light control part LCP may change a wavelength of light provided from the display element part DPL. The light control part LCP may include a color conversion part CCL and a color filter part CFL.

According to one or more embodiments, the light emitting elements LD disposed in each of the first sub pixel SPXL1, the second sub pixel SPXL2, and the third sub pixel SPXL3 may emit light of the same color. For example, the first sub pixel SPXL1, the second sub pixel SPXL2, and the third sub pixel SPXL3 may include light emitting elements LD emitting light of a third color (e.g., blue light). The light control part LCP may be disposed on the first sub pixel SPXL1, the second sub pixel SPXL2, and the third sub pixel SPXL3 to display a full-color image. However, the present disclosure is not limited thereto, and the first sub pixel SPXL1, the second sub pixel SPXL2, and the third sub pixel SPXL3 may include light emitting elements LD emitting light of different colors from each other.

The color conversion part CCL may include a first passivation layer PSS1, a wavelength conversion pattern WCP, a light transmission pattern LTP, a light blocking layer LBL, and a second passivation layer PSS2. The wavelength conversion pattern WCP may include a first wavelength conversion pattern WCP1 and a second wavelength conversion pattern WCP2.

The first passivation layer PSS1 may be disposed between the display element part DPL and the light blocking layer LBL and/or between the display element part DPL and the wavelength conversion pattern WCP. The first passivation layer PSS1 may seal (or cover) the wavelength conversion pattern WCP. The first passivation layer PSS1 may include any one of materials listed with reference to the insulating film INF, but is not limited to a specific example.

In one or more embodiments, an adhesive layer may be interposed between the first passivation layer PSS1 and the second electrode ELT2. The adhesive layer may combine the first passivation layer PSS1 and the second electrode ELT2. The adhesive layer may include any suitable adhesive material, and is not limited to a specific example.

The first wavelength conversion pattern WCP1 may be disposed to overlap an emission area EMA (e.g., the first sub pixel area SPXA1) of the first sub pixel SPXL1. For example, the first wavelength conversion pattern WCP1 may be disposed in a space defined by the light blocking layer LBL and may overlap the first sub pixel area SPXA1 when viewed in a plan view.

According to one or more embodiments, the light blocking layer LBL may include a plurality of walls, and the first wavelength conversion pattern WCP1 may be provided in a space between the plurality of walls disposed in an area corresponding to the first sub pixel SPXL1.

The second wavelength conversion pattern WCP2 may be disposed to overlap the emission area EMA (e.g., the second sub pixel area SPXA2) of the second sub pixel SPXL2. For example, the second wavelength conversion pattern WCP2 may be disposed in a space defined by the light blocking layer LBL and may overlap the second sub pixel area SPXA2 when viewed in a plan view.

According to one or more embodiments, the light blocking layer LBL may include a plurality of walls, and the second wavelength conversion pattern WCP2 may be provided in a space between the plurality of walls disposed in an area corresponding to the second sub pixel SPXL2.

The light transmission pattern LTP may be disposed to overlap the emission area EMA (e.g., the third sub pixel area SPXA3) of the third sub pixel SPXL3. For example, the light transmission pattern LTP may be disposed in a space defined by the light blocking layer LBL and may overlap the third sub pixel area SPXA3 when viewed in a plan view.

According to one or more embodiments, the light blocking layer LBL may include a plurality of walls, and the light transmission pattern LTP may be provided in a space between the plurality of walls disposed in an area corresponding to the third sub pixel SPXL3.

According to one or more embodiments, the first wavelength conversion pattern WCP1 may include first color conversion particles that convert light of a third color emitted from the light emitting element LD into light of a first color. For example, when the light emitting element LD is a blue light emitting element emitting blue light and the first sub pixel SPXL1 is a red pixel, the first wavelength conversion pattern WCP1 may include a first quantum dot that converts the blue light emitted from the blue light emitting element into red light.

For example, the first wavelength conversion pattern WCP1 may include a plurality of first quantum dots dispersed in a matrix material (e.g., a predetermined matrix material) such as a base resin. The first quantum dot may absorb the blue light and shift a wavelength according to an energy transition to emit the red light. Meanwhile, when the first sub pixel SPXL1 is a pixel of a different color, the first wavelength conversion pattern WCP1 may include a first quantum dot corresponding to the color of the first sub pixel SPXL1.

According to one or more embodiments, the second wavelength conversion pattern WCP2 may include second color conversion particles that convert light of a third color emitted from the light emitting element LD into light of a second color. For example, when the light emitting element LD is a blue light emitting element emitting blue light and the second sub pixel SPXL2 is a green pixel, the second wavelength conversion pattern WCP2 may include a second quantum dot that converts the blue light emitted from the blue light emitting element light into green light.

For example, the second wavelength conversion pattern WCP2 may include a plurality of second quantum dots dispersed in a matrix material (e.g., a predetermined matrix material) such as a base resin. The second quantum dot may absorb the blue light and shift a wavelength according to an energy transition to emit the green light. Meanwhile, when the second sub pixel SPXL2 is a pixel of a different color, the second wavelength conversion pattern WCP2 may include a second quantum dot corresponding to the color of the second sub pixel SPXL2.

Meanwhile, the first quantum dot and the second quantum dot may have a shape of a globular shape, a pyramid shape, a multi-arm, or a cubic nanoparticle, a nanotube, a nanowire, a nanofiber, a nanoplate particle, or the like, but the shape is not limited thereto, and the shape of the first quantum dot and the second quantum dot may be variously changed in a suitable manner.

In one or more embodiments, an absorption coefficient of the first quantum dot and the second quantum dot may be increased by injecting the blue light having a relatively short wavelength in a visible light area to each of the first quantum dot and the second quantum dot. Accordingly, efficiency of light emitted from the first sub pixel SPXL1 and the second sub pixel SPXL2 may be increased, and excellent color reproducibility may be secured. In addition, manufacturing efficiency of the display device may be increased by configuring the pixel unit of the first to third sub pixels SPXL1, SPXL2, and SPXL3 using the light emitting elements LD (e.g., blue light emitting elements) of the same color.

According to one or more embodiments, the light transmission pattern LTP may be provided to efficiently use the light of the third color emitted from the light emitting element LD. For example, when the light emitting element LD is a blue light emitting element emitting blue light and the third sub pixel SPXL3 is a blue pixel, the light transmission pattern LTP may include at least one type of light scattering particles in order to efficiently use the light emitted from the light emitting element LD.

For example, the light transmission pattern LTP may include a plurality of light scattering particles dispersed in a matrix material (e.g., a predetermined matrix material) such as a base resin. For example, the light transmission pattern LTP may include light scattering particles such as silica, but a configuration material of the light scattering particles is not limited thereto.

Meanwhile, the light scattering particles may not be disposed in the third sub pixel area SPXA3 in which the third sub pixel SPXL3 is formed. For example, the light scattering particles may be selectively included in the first wavelength conversion pattern WCP1 and/or the second wavelength conversion pattern WCP2.

The light blocking layer LBL may be disposed on the display element part DPL. The light blocking layer LBL may be disposed on the substrate SUB. The light blocking layer LBL may be disposed between the first passivation layer PSS1 and the second passivation layer PSS2. The light blocking layer LBL may be disposed to surround the first wavelength conversion pattern WCP1, the second wavelength conversion pattern WCP2, and the light transmission pattern LTP at a boundary between the sub pixels SPXL.

According to one or more embodiments, the light blocking layer LBL may define the emission area EMA and a non-emission area NEA of the sub pixel SPXL. The light blocking layer LBL may define the first to third sub pixel areas SPXA1, SPXA2, and SPXA3.

For example, the light blocking layer LBL may not overlap the emission area EMA when viewed in a plan view. The light blocking layer LBL may overlap the non-emission area NEA when viewed in a plan view. An area in which the light blocking layer LBL is not disposed may be defined as the emission area EMA of the first to third sub pixels SPXL1, SPXL2, and SPXL3. The emission area EMA of the first sub pixel SPXL1 may be the first sub pixel area SPXA1, the emission area EMA of the second sub pixel SPXL2 may be the second sub pixel area SPXA2, and the emission area EMA of the third sub pixel SPXL3 may be the third sub pixel area SPXA3.

According to one or more embodiments, the light blocking layer LBL may be formed of an organic material including at least one of graphite, carbon black, black pigment, or black dye, or may be formed of a metal material including chromium (Cr), but is not limited thereto as long as the material of the light blocking layer LBL is a material capable of blocking light transmission and absorbing light.

The second passivation layer PSS2 may be disposed between the color filter part CFL and the light blocking layer LBL and/or between the color filter part CFL and the wavelength conversion pattern WCP. The second passivation layer PSS2 may seal (or cover) the first wavelength conversion pattern WCP1, the second wavelength conversion pattern WCP2, and the light transmission pattern LTP. The second passivation layer PSS2 may include any one of materials listed with reference to the insulating film INF, but is not limited to a specific example.

According to one or more embodiments, the color filter part CFL may be disposed on the color conversion part CCL. The color filter part CFL may include a color filter CF and a planarization layer PLA. Here, the color filter CF may include a first color filter CF1, a second color filter CF2, and a third color filter CF3.

According to one or more embodiments, the color filter CF may be disposed on the second passivation layer PSS2. When viewed in a plan view, the color filter CF may overlap the emission area EMA of the first to third sub pixels SPXL1, SPXL2, and SPXL3.

For example, the first color filter CF1 may be disposed in the first sub pixel area SPXA1, the second color filter CF2 may be disposed in the second sub pixel area SPXA2, and the third color filter CF3 may be disposed in the third sub pixel area SPXA3.

According to one or more embodiments, the first color filter CF1 may transmit light of a first color, and may not transmit light of a second color and/or light of a third color. For example, the first color filter CF1 may include a colorant regarding the first color.

According to one or more embodiments, the second color filter CF2 may transmit the light of the second color, and may not transmit the light of the first color and the light of the third color. For example, the second color filter CF2 may include a colorant regarding the second color.

According to one or more embodiments, the third color filter CF3 may transmit the light of the third color, and may not transmit the light of the first color and the light of the second color. For example, the third color filter CF3 may include a colorant regarding the third color.

According to one or more embodiments, the planarization layer PLA may be disposed on the color filter CF. The planarization layer PLA may cover the color filter CF. The planarization layer PLA may cancel a step difference generated by the color filter CF. In other words, the planarization layer PLA may cover a step of the color filter CF and have a flat upper surface or a substantially flat upper surface.

According to an example, the planarization layer PLA may include an organic insulating material. However, the present disclosure is not limited thereto, and the planarization layer PLA may include an inorganic material listed with reference to the insulating film INF.

A structure of the first to third sub pixels SPXL1, SPXL2, and SPXL3 is not limited to the contents described above with reference to FIG. 5, and various suitable structures may be appropriately or suitably selected to provide the display device DD according to one or more embodiments. For example, according to one or more embodiments, the display device DD may further include a low refractive index layer to improve light efficiency.

Hereinafter, a positional relationship between the light emitting element LD and the sub pixel SPXL of the display device DD according to one or more embodiments is described with reference to FIGS. 6 to 10. Contents that may be repetitive with respect to the above-described contents are simplified or not repeated.

Figure 6:
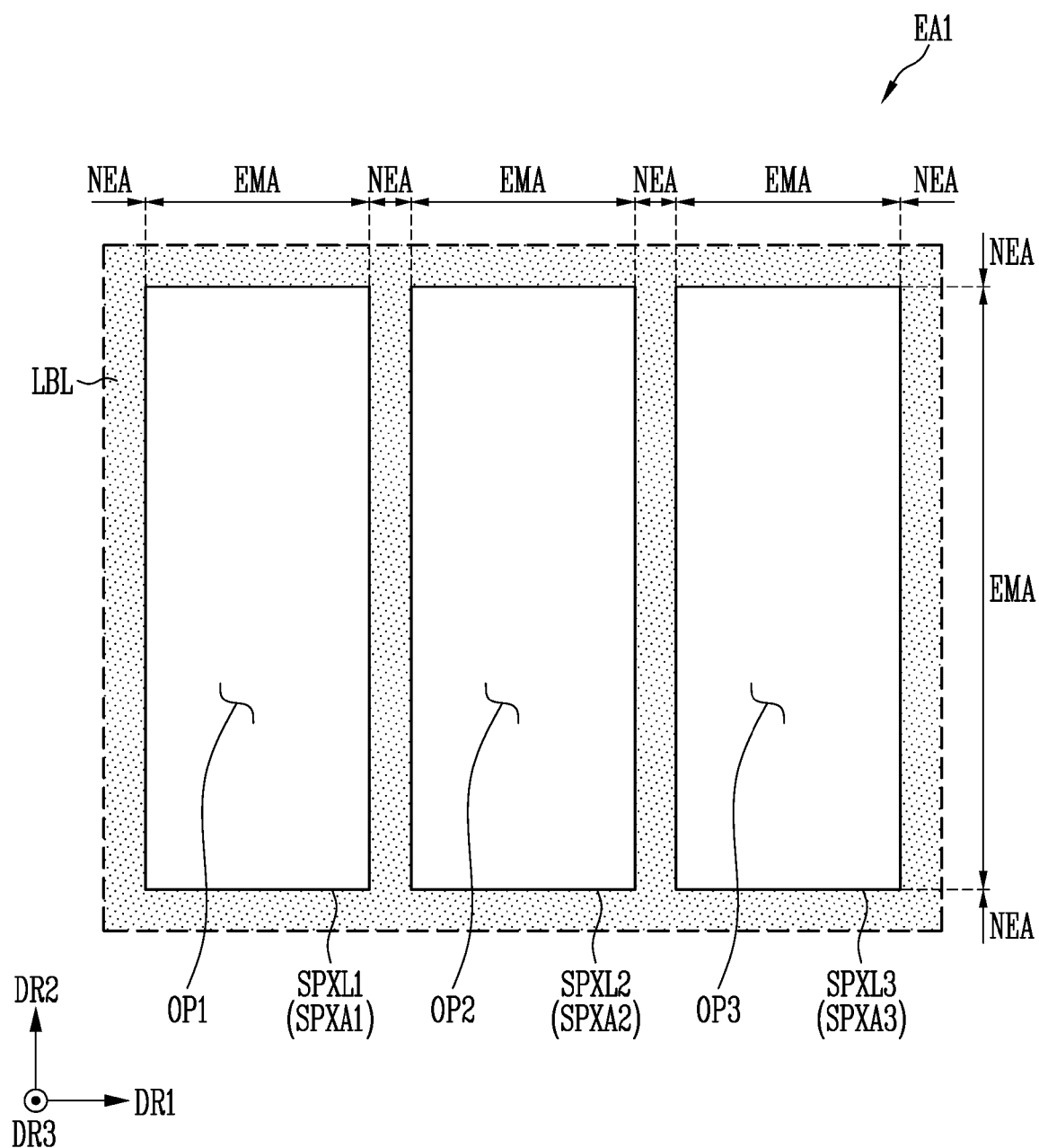
FIGS. 6 to 8 are enlarged views of EA1 of FIG. 2.
Figure 7:
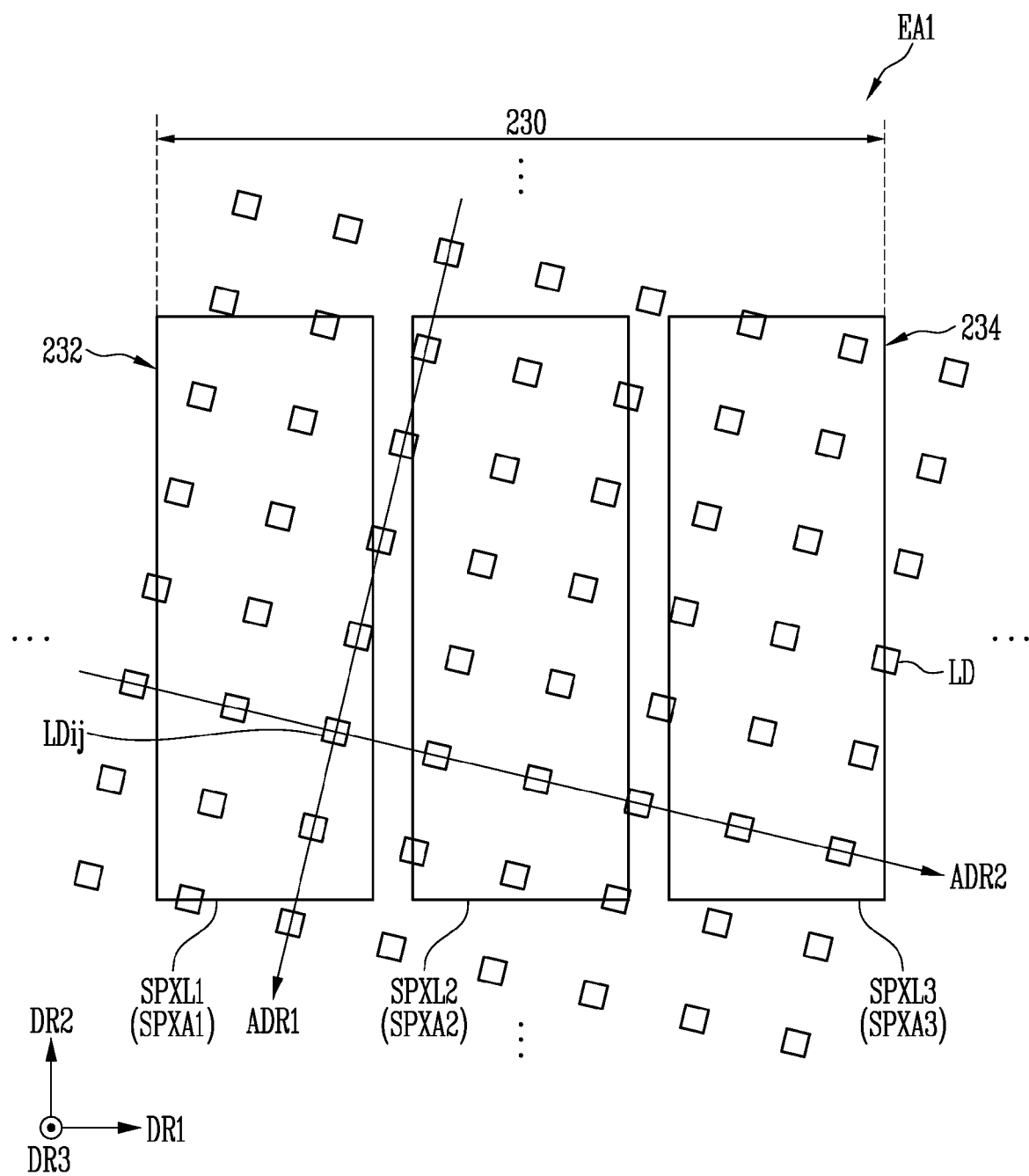
Figure 8:
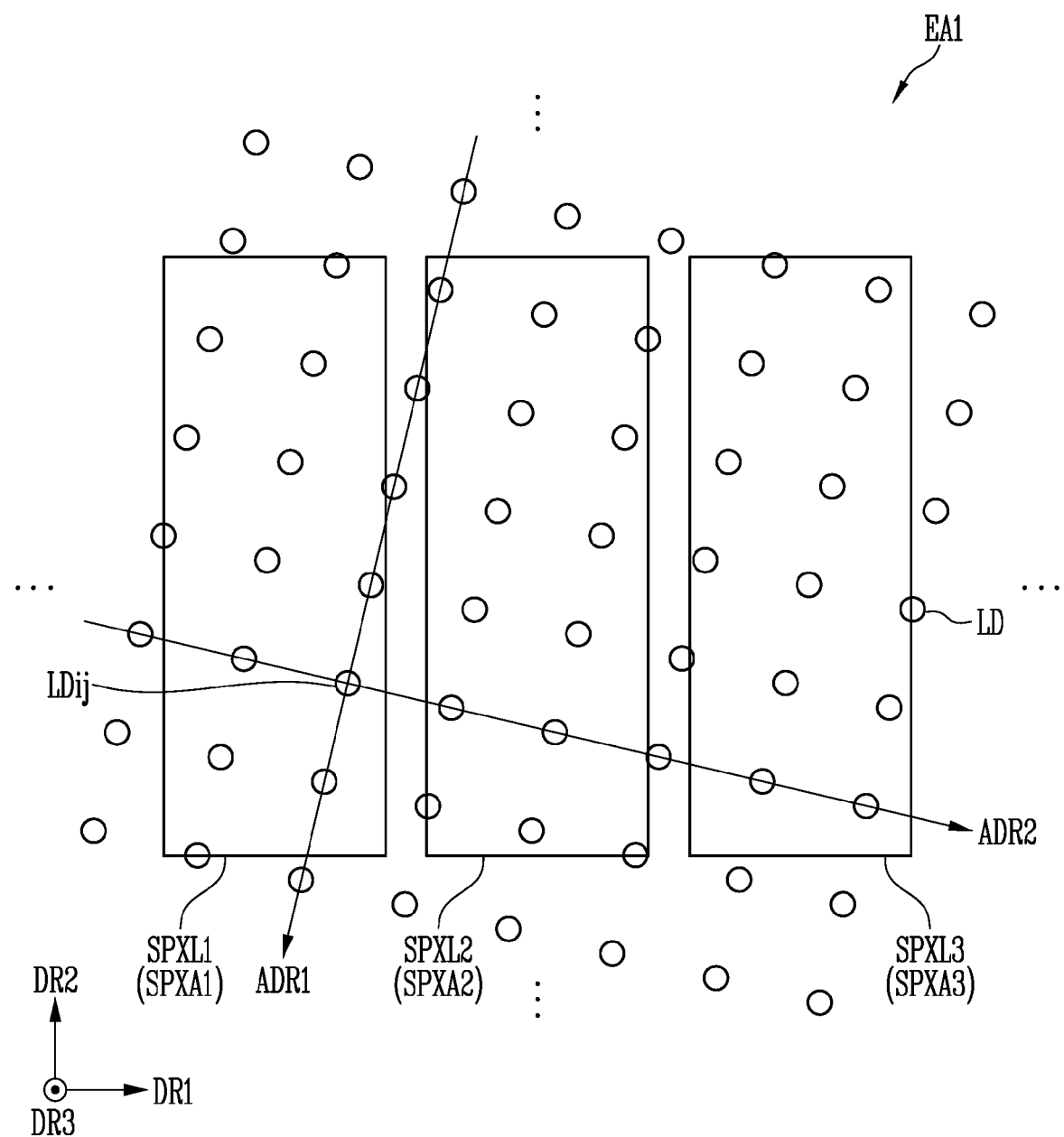

FIGS. 6 to 8 are enlarged views of EA1 of FIG. 2. Here, FIG. 6 shows EA1 based on the color conversion part CCL that defines areas of the sub pixels SPXL. FIGS. 7 and 8 show EA1 based on an arrangement form of the light emitting elements LD included in the sub pixels SPXL.

Referring to FIG. 6, positions of the first to third sub pixels SPXL1, SPXL2, and SPXL3 (and/or the first to third sub pixel areas SPXA1, SPXA2, and SPXA3) may be defined by the light blocking layer LBL.

For example, an area in which the light blocking layer LBL is not disposed may be the emission EMA in which light emitted from the first to third sub pixels SPXL1, SPXL2, and SPXL3 is provided to the outside. An area in which the light blocking layer LBL is disposed may be the non-emission area NEA in which the light emitted from the first to third sub pixels SPXL1, SPXL2, and SPXL3 is not substantially provided to the outside.

According to one or more embodiments, the light blocking layer LBL may include a first opening OP1, a second opening OP2, and a third opening OP3. The first opening OP1, the second opening OP2, and the third opening OP3 may be an area in which the light blocking layer LBL is not disposed. According to an example, a position of the first opening OP1 may correspond to the first sub pixel area SPXA1, a position of the second opening OP2 may correspond to the second sub pixel area SPXA2, and a position of the third opening OP3 may correspond to the third sub pixel area SPXA3.

At least a portion of the light blocking layer LBL may be provided in a shape around (e.g., surrounding) an area intended to be provided as the first sub pixel SPXL1 (e.g., the first sub pixel area SPXA1), and thus the first opening OP1 may be formed. At this time, the first sub pixel area SPXA1 may be defined in the first opening OP1. The first sub pixel area SPXA1 may be an area in which the first sub pixel SPXL1 is disposed, and may refer to the emission area EMA of the first sub pixel SPXL1.

According to one or more embodiments, the wavelength conversion pattern WCP including a first wavelength conversion material may be disposed at a position corresponding to the first opening OP1. Accordingly, the light emitted from the light emitting element LD included in the first sub pixel SPXL1 may be provided as light having a first color and output to the outside.

At least a portion of the light blocking layer LBL may be provided in a shape around (e.g., surrounding) an area intended to be provided as the second sub pixel SPXL2 (e.g., the second sub pixel area SPXA2), and thus the second opening OP2 may be formed. At this time, the second sub pixel area SPXA2 may be defined in the second opening OP2. The second sub pixel area SPXA2 may be an area in which the second sub pixel SPXL2 is disposed, and may refer to the emission area EMA of the second sub pixel SPXL2.

According to one or more embodiments, the wavelength conversion pattern WCP including a second wavelength conversion material may be disposed at a position corresponding to the second opening OP2. Accordingly, the light emitted from the light emitting element LD included in the second sub pixel SPXL2 may be provided as light having a second color and output to the outside.

At least a portion of the light blocking layer LBL may be provided in a shape around (e.g., surrounding) an area intended to be provided as the third sub pixel SPXL3 (e.g., the third sub pixel area SPXA3), and thus the third opening OP3 may be formed. At this time, the third sub pixel area SPXA3 may be defined in the third opening OP3. The third sub pixel area SPXA3 may be an area in which the third sub pixel SPXL3 is disposed, and may refer to the emission area EMA of the third sub pixel SPXL3.

According to one or more embodiments, a separate wavelength conversion material may not be disposed at a position corresponding to the third opening OP3. Accordingly, the light emitted from the light emitting element LD included in the third sub pixel SPXL3 may be provided as light having a third color and output to the outside.

According to one or more embodiments, the first to third sub pixels SPXL1, SPXL2, and SPXL3 may be spaced from each other in a first direction DR1. The first to third sub pixel areas SPXA1, SPXA2, and SPXA3 may be spaced from each other in the first direction DR1.

According to an example, the first sub pixel area SPXA1 may be disposed on or at a side of the second sub pixel area SPXA2, and the third sub pixel area SPXA3 may be disposed on or at another side of the second sub pixel area SPXA2.

According to one or more embodiments, the first to third sub pixels SPXL1, SPXL2, and SPXL3 may extend in a second direction DR2. The first to third sub pixel areas SPXA1, SPXA2, and SPXA3 may be spaced from each other in the second direction DR2.

Here, the first direction DR1 and the second direction DR2 may cross each other. The first direction DR1 and the second direction DR2 may be non-parallel to each other. According to an example, the first direction DR1 and the second direction DR2 may be orthogonal to each other.

FIGS. 7 and 8 show a structure in which the light emitting elements LD are arranged. FIG. 7 is a diagram illustrating an arrangement structure of the light emitting element LD according to a first embodiment. FIG. 8 is a diagram illustrating an arrangement structure of the light emitting element LD according to a second embodiment.

Referring to FIGS. 7 and 8, the light emitting elements LD may be arranged in a matrix form.

The light emitting elements LD may be disposed in a matrix form defined by or along a row direction extending in a first arrangement direction ADR1 and a column direction extending in a second arrangement direction ADR2. However, according to one or more embodiments, the light emitting elements LD may be disposed in a matrix form defined by or along a column direction extending in the first arrangement direction ADR1 and a row direction extending in the second arrangement direction ADR2.

Here, the first arrangement direction ADR1 and the second arrangement direction ADR2 may cross each other. The first arrangement direction ADR1 and the second arrangement direction ADR2 may be non-parallel to each other. According to one or more embodiments, the first arrangement direction ADR1 and the second arrangement direction ADR2 may be orthogonal to each other.

According to one or more embodiments, the light emitting elements LD may be arranged at positions corresponding to each row and column in the matrix form. In the matrix form, an ij-th light emitting element LDij may refer to the light emitting element LD arranged in an i-th row and a j-th column. For example, a light emitting element LD may be disposed in a first column of a first row, and another light emitting element LD may be disposed in a tenth column of a tenth row.

Referring to FIG. 7, when viewed in a plan view, the light emitting element LD may have a quadrangle shape (or a square shape). For example, when the light emitting element LD has a rectangular parallelepiped shape, the light emitting element LD may be provided in a quadrangle shape (or a square shape) when viewed in a plan view.

Alternatively, referring to FIG. 8, when viewed in a plan view, the light emitting element LD may have a circular shape. For example, when the light emitting element LD is provided in a pillar shape of which a bottom surface is a circular shape, the light emitting element LD may be provided in a circular shape when viewed in a plan view.

However, the shape of the light emitting element LD is not limited to the above-described examples, and according to one or more embodiments, a light emitting element LD having any suitable bottom shape may be provided.

According to one or more embodiments, the number per unit area of light emitting elements LD on the substrate SUB may be uniform. The number per unit area of the light emitting elements LD disposed in the first to third sub pixel areas SPXA1, SPXA2, and SPXA3 may be substantially uniform.

For example, the light emitting elements LD may include a first plurality of light emitting elements disposed in the first sub pixel area SPXA1, a second plurality of light emitting elements disposed in the second sub pixel area SPXA2, and a third plurality of light emitting elements disposed in the third sub pixel area SPXA3. Here, the number of each of the first plurality of light emitting elements, the second plurality of light emitting elements, and the third plurality of light emitting elements may be substantially the same as each other or may be less than or equal to a difference (e.g., a predetermined difference).

According to one or more embodiments, the light emitting elements LD may be generally arranged side by side along the first arrangement direction ADR1. The light emitting elements LD may be generally arranged side by side along the second arrangement direction ADR2. That is, regardless of the shape of the light emitting element LD, a matrix arrangement form may be clearly defined according to an arrangement position of the light emitting element LD.

According to one or more embodiments, at least some of the light emitting elements LD arranged in the matrix form may be disposed in the first to third sub pixel areas SPXA1, SPXA2, and SPXA3. For example, the light emitting element LD may be disposed in the first to third sub pixel areas SPXA1, SPXA2, and SPXA3, or may not be disposed in the first to third sub pixel areas SPXA1, SPXA2, and SPXA3, intermittently.

However, according to one or more embodiments of the present disclosure, the number of the light emitting elements LD which are not disposed in the first to third sub pixel areas SPXA1, SPXA2, and SPXA3 may be minimized or reduced. This is described later with reference to FIGS. 9 and 10.

Figure 9:
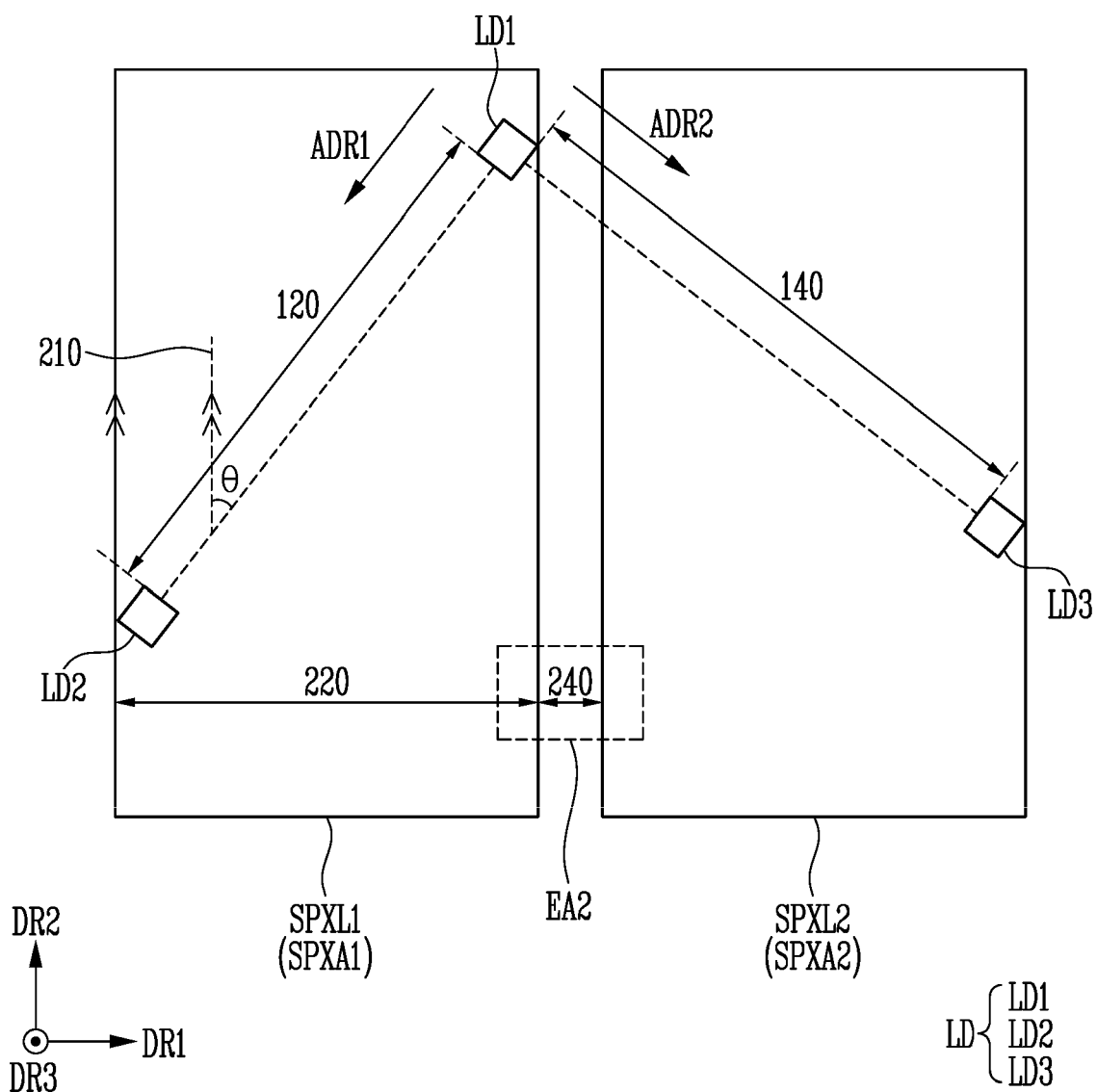
FIGS. 9 and 10 are plan views schematically illustrating a positional relationship of light emitting elements included in a display device according to one or more embodiments.
Figure 10:
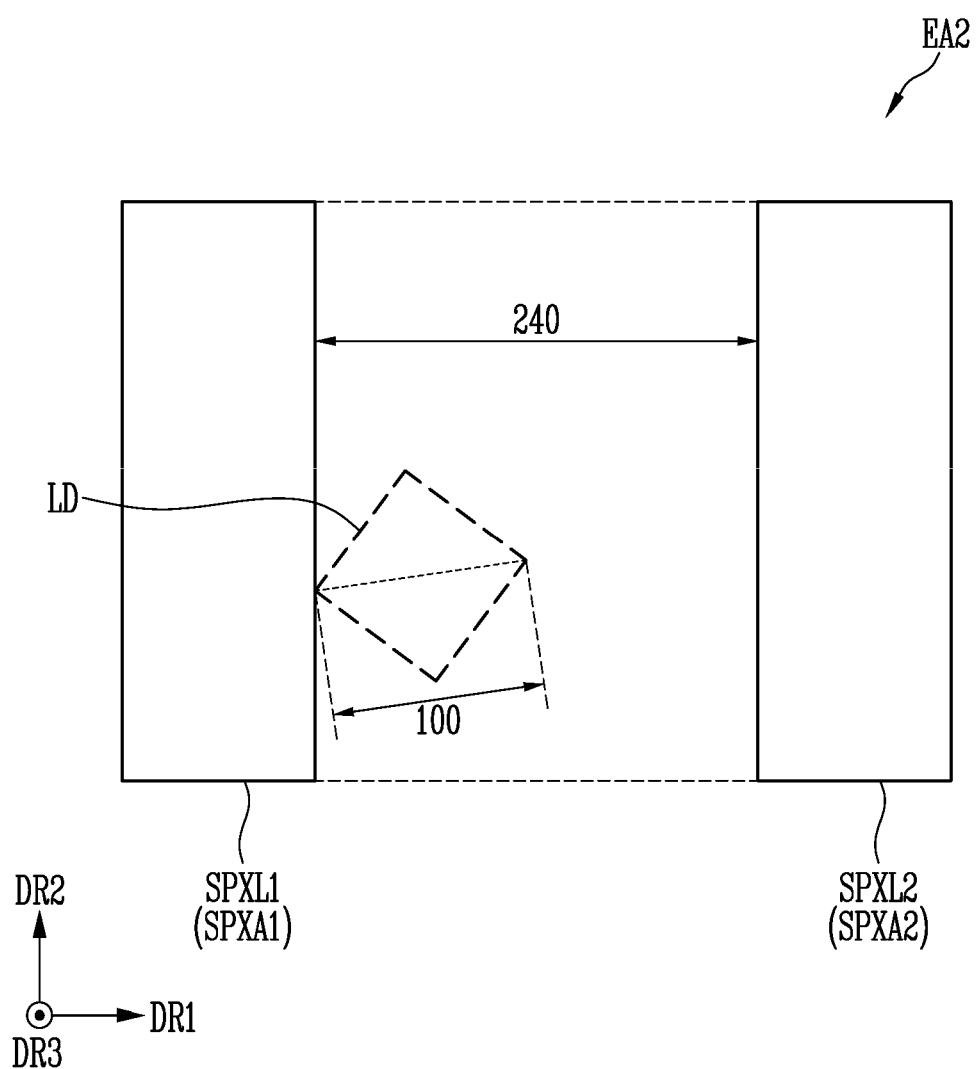

FIGS. 9 and 10 are plan views schematically illustrating a positional relationship of light emitting elements included in a display device according to one or more embodiments. FIG. 10 is an enlarged view of EA2 of FIG. 9.

In FIGS. 9 and 10, for convenience of description, the first sub pixel SPXL1 and the second sub pixel SPXL2 are mainly shown. A technical feature of the first sub pixel SPXL1 and the second sub pixel SPXL2 described with reference to FIGS. 9 and 10 may be defined and applied to the sub pixels SPXL.

In addition, in FIG. 9, for convenience of description, the description is given based on a first light emitting element LD1, a second light emitting element LD2, and a third light emitting element LD3 adjacent to each other among the plurality of light emitting elements LD. The light emitting elements LD may include the first light emitting element LD1, the second light emitting element LD2, and the third light emitting element LD3.

According to one or more embodiments, the first light emitting element LD1 and the second light emitting element LD2 may be disposed in the first sub pixel area SPXA1. Accordingly, light emitted from the first light emitting element LD1 and the second light emitting element LD2 may be included in the light emitted from the first sub pixel SPXL1.

According to one or more embodiments, the third light emitting element LD3 may be disposed in the second sub pixel area SPXA2. Accordingly, light emitted from the third light emitting element LD3 may be included in the light emitted from the second sub pixel SPXL2.

According to one or more embodiments, the first light emitting element LD1 may be adjacent to the second light emitting element LD2 along the first arrangement direction ADR1. The first light emitting element LD1 and the second light emitting element LD2 may be spaced from each other by a first arrangement distance 120. Here, the first arrangement distance 120 may refer to the shortest distance between the first light emitting element LD1 and the second light emitting element LD2.

According to one or more embodiments, the first light emitting element LD1 may be adjacent to the third light emitting element LD3 along the second arrangement direction ADR2. The first light emitting element LD1 and the third light emitting element LD3 may be spaced from each other by a second arrangement distance 140. Here, the second arrangement distance 140 may refer to the shortest distance between the first light emitting element LD1 and the third light emitting element LD3.

According to an example, the first arrangement distance 120 and the second arrangement distance 140 may be the same. Accordingly, the light emitting elements LD described above with reference to FIGS. 7 and 8 may be provided so that distances by which the adjacent light emitting elements LD are spaced apart are the same. However, according to one or more embodiments, the light emitting elements LD may be provided so that the first arrangement distance 120 and the second arrangement distance 140 are different from each other.

A direction in which the first sub pixel SPXL1 and the second sub pixel SPXL2 extend and the first arrangement direction ADR1 may cross each other. The direction in which the first sub pixel SPXL1 and the second sub pixel SPXL2 extend and the first arrangement direction ADR1 may be non-parallel to each other.

For example, as described above, the sub pixels SPXL may be spaced from each other in the first direction DR1 and may extend in the second direction DR2. Accordingly, the first arrangement direction ADR1 and the second arrangement direction DR2 may cross. The first arrangement direction ADR1 and the second direction DR2 may be non-parallel to each other.

Specifically, referring to FIG. 9, an extension line 210 parallel to a direction in which the first sub pixel SPXL1 extends and the first arrangement direction ADR1 may form a gap angle θ. Here, the extension line 210 may be parallel to the second direction DR2.

For example, the second direction DR2 may form the gap angle θ having an acute angle with the first arrangement direction ADR1.

According to one or more embodiments, the gap angle θ may not be 0 degrees, 45 degrees, and 90 degrees. According to an example, the gap angle θ may be 5 degrees to 40 degrees. Alternatively, the gap angle θ may be 10 degrees to 35 degrees.

According to the present disclosure, the gap angle θ may be formed to avoid a value of 0 degrees, 45 degrees, and 90 degrees, and thus the number of light emitting elements LD which are not arranged in the first to third sub pixel areas SPXA1, SPXA2, and SPXA3 may be reduced. Accordingly, disposition efficiency of the light emitting element LD may be improved.

According to one or more embodiments, a separation distance (e.g., the first arrangement distance 120 and the second arrangement distance 140) between the light emitting elements LD may satisfy a numerical relationship (e.g., a predetermined numerical relationship) with a first length 220. Here, the first length 220 may refer to a length of one side of the sub pixel SPXL parallel to the first direction DR1. For example, referring to FIG. 9, the first length 220 may refer to the length of one side of the first sub pixel SPXL1 parallel to the first direction DR1.

According to one or more embodiments, the separation distance between the light emitting elements LD and the first length 220 may satisfy Equation 1 below.

$$y \leq \frac{x_1}{\sqrt{2}} \quad \text{Equation 1}$$

Here, $x_1$ refers to the first length 220, and y refers to the separation distance between the light emitting elements LD. Accordingly, y may refer to the first arrangement distance 120 and/or the second arrangement distance 140.

However, according to one or more embodiments, the separation distance y between the light emitting elements LD and a length $x_2$ of one side along the first direction DR1 of the pixel PXL may satisfy Equation 2 below.

$$y \le \frac{x_2/n}{\sqrt{2}} \qquad \text{Equation 2}$$

Here, $x_2$ may refer to a second length 230 of the pixel PXL. The second length 230 may refer to a length of the pixel PXL in the first direction DR1. For example, when the pixel PXL is configured of first to third sub pixels SPXL1, SPXL2, and SPXL3 sequentially arranged in the first direction DR1, the second length 230 may refer to a separation distance between an end portion 232 of the first sub pixel SPXL1 (or the first sub pixel area SPXA1) and another end portion 234 of the third sub pixel SPXL3 (or the third sub pixel area SPXA3), based on the first direction DR1. In one or more embodiments, the end portion 232 of the first sub pixel SPXL1 (or the first sub pixel area SPXA1) and the other end portion 234 of the third sub pixel SPXL3 (or the third sub pixel area SPXA3) may be at opposite, outer ends of the pixel PXL.

n is the number of sub pixels SPXL arranged along the first direction DR1, for example, when the pixel PXL is configured of the first to third sub pixels SPXL1, SPXL2, and SPXL3, n may be 3.

According to the present example, the distance between the light emitting elements LD and a length relationship between the pixels PXL may be derived, by defining the length of one side of one sub pixel SPXL based on the length of one side of the pixel PXL configured of the sub pixels SPXL and the number of sub pixels SPXL. In this case, when a process proceeds, convenience of designing the arrangement of the light emitting elements LD may be increased.

Meanwhile, referring to FIG. 10, a separation distance 240 between the first sub pixel SPXL1 and the second sub pixel SPXL2 and a length characteristic of the light emitting element LD may satisfy a numerical relationship (e.g., a predetermined numerical relationship) with each other.

For example, the separation distance 240 between the first sub pixel SPXL1 and the second sub pixel SPXL2 along the first direction DR1 may be determined by a length characteristic of the single light emitting element LD.

According to one or more embodiments, the light emitting element LD may have a bottom surface length (e.g., a predetermined bottom surface length) 100 when viewed in a plan view. Here, the bottom surface length 100 of the light emitting element LD may be a length determined according to a shape of a bottom surface of the light emitting element LD.

For example, when the bottom surface of the light emitting element LD has a square (or rectangle) shape, the bottom surface length 100 may refer to a diagonal length of a square (or rectangle). Alternatively, when the bottom surface of the light emitting element LD has a circular shape, the bottom surface length 100 may refer to a diameter of a circle. Alternatively, when the bottom surface of the light emitting element LD has an elliptical shape, the bottom surface length 100 may refer to a major radius of an ellipse.

According to one or more embodiments, a distance between the bottom surface length 100 of the light emitting element LD and the sub pixels SPXL may satisfy Equation 3 below.

$$z \ge w*\sqrt{2} \qquad \text{Equation 3}$$

Here, z may be a distance between the sub pixels SPXL. For example, z may be the separation distance 240 according to the first direction DR1 between the first sub pixel SPXL1 (or the first sub pixel area SPXA1) and the second sub pixel SPXL2 (or the second sub pixel area SPXA2). Further, w may be the bottom surface length 100 of the light emitting element LD.

According to the present example, a distance between the sub pixels SPXL may be defined according to a characteristic length of the light emitting element LD, and thus a short defect may be prevented or substantially prevented.

According to the present embodiment, a relationship between the distance between the light emitting elements LD and the length of the sub pixels SPXL may be defined by an equation (e.g., a predetermined equation). Therefore, convenience of process design may be increased and a short defect may be prevented or substantially prevented. Accordingly, the display device DD with improved reliability may be provided.

Hereinafter, a method of manufacturing the display device DD according to one or more embodiments is described with reference to FIGS. 11 to 18. Contents that may be repetitive with respect to the above-described contents are simplified or not repeated.

FIGS. 11 to 15, and 17 are cross-sectional views for each step (or act) of the method of manufacturing the display device DD. FIGS. 16 and 18 are plan views for each step (or act) of the method of manufacturing the display device DD.

Figure 11:
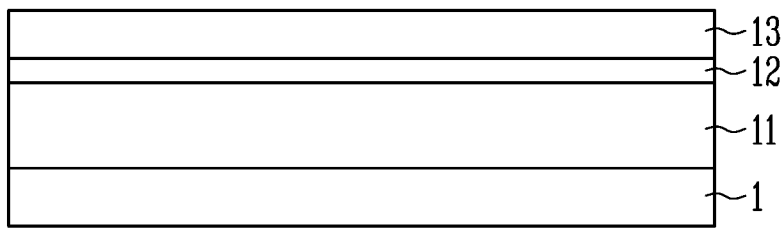
FIGS. 11 to 15, and 17 are cross-sectional views for each step (or act) of a method of manufacturing a display device according to one or more embodiments.

Referring to FIG. 11, a stack substrate 1 may be prepared (or provided), and the first semiconductor layer 11, the active layer 12, and the second semiconductor layer 13 may be formed on the stack substrate 1.

According to one or more embodiments, the stack substrate 1 may be a base plate for stacking an object material. The stack substrate 1 may be a wafer for epitaxial growth on a material (e.g., a predetermined material). According to an example, the stack substrate 1 may be any one of a sapphire substrate, a GaAs substrate, a Ga substrate, and an InP substrate, but is not limited thereto. For example, when a specific material satisfies a selectivity for manufacturing the light emitting element LD, and epitaxial growth for a material (e.g., a predetermined material) may be smoothly generated, the specific material may be selected as a material of the stack substrate 1.

In the present step (or act), the first semiconductor layer 11, the active layer 12, and the second semiconductor layer 13 may be formed by any one method among metal organic chemical vapor-phase deposition (MOCVD), molecular beam epitaxy (MBE), vapor phase epitaxy (VPE), and liquid phase epitaxy (LPE).

Figure 12:
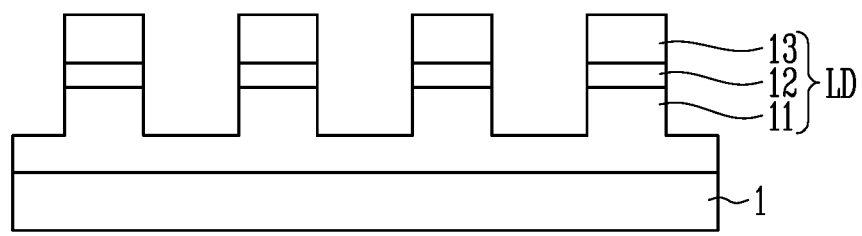

Referring to FIG. 12, the light emitting elements LD separated individually from each other may be provided, by removing at least a portion of each of the first semiconductor layer 11, the active layer 12, and the second semiconductor layer 13.

In the present step (or act), an etching process may be performed on the first semiconductor layer 11, the active layer 12, and the second semiconductor layer 13. In order to form the individually separated light emitting elements LD, a mask may be disposed in a structure in which the first semiconductor layer 11, the active layer 12, and the second semiconductor layer 13 are stacked (e.g., sequentially stacked), and an etching process may be performed, to perform patterning of a nano scale or micro scale distance. The etching process may be performed in a direction from the second semiconductor layer 13 toward the first semiconductor layer 11.

According to an example, the etching process may be any one of reactive ion etching (RIE), reactive ion beam etching (RIBE), and inductively coupled plasma reactive ion etching (ICP-RIE), but is not limited to a specific example.

In the present step (or act), the provided light emitting elements LD may be patterned in a matrix form defined by the first arrangement direction ADR1 and the second arrangement direction ADR2.

Figure 13:
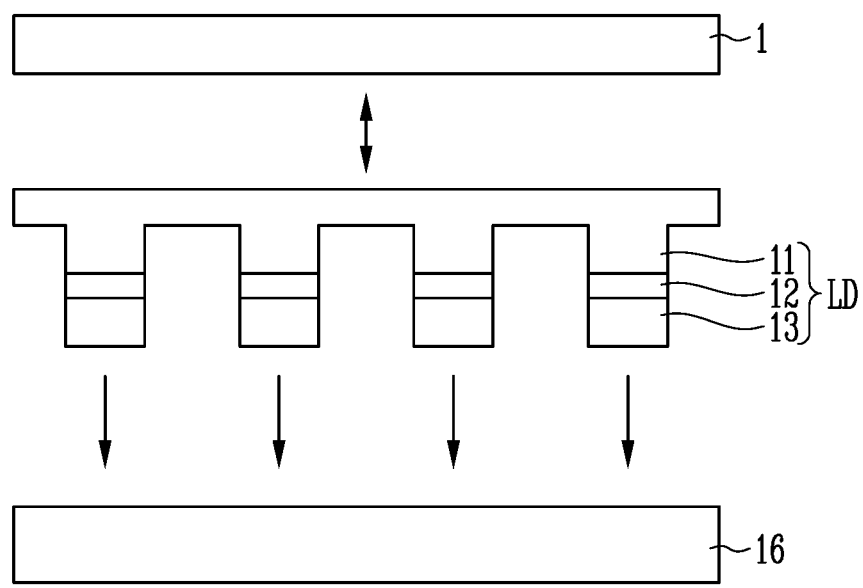

Referring to FIG. 13, the stack substrate 1 may be separated from the light emitting elements LD, and the light emitting elements LD may be combined (disposed, or connected) on a donor film 16.

In the present step (or act), the stack substrate 1 may be physically separated from the first semiconductor layer 11. According to an example, the stack substrate 1 and the first semiconductor layer 11 may be separated by a laser lift-off (LLO) method. However, the present disclosure is not limited thereto, and according to one or more embodiments, the stack substrate 1 and the first semiconductor layer 11 may be separated by a chemical lift-off (CLO) method.

In the present step (or act), a layer, which is formed in the same process as the first semiconductor layer 11, is not etched separately, and thus does not configure the individual light emitting element LD, may also be removed. Accordingly, the present step (or act) may be performed, an array of the plurality of light emitting element LD patterned at a distance (e.g., a predetermined distance) on the donor film 16 may be provided.

According to one or more embodiments, the donor film 16 may be a configuration for preparing the light emitting element LD at a position (e.g., a predetermined position) before performing a subsequent process (e.g., a process of disposing the light emitting elements LD on the substrate SUB and the pixel circuit part PCL). The donor film 16 may be referred to as a donor wafer or a donor substrate. The donor film 16 may be an isotropically stretchable film. According to an example, the donor film 16 may include a polymer composition (e.g., a polyvinyl chloride (PVC)-based material), but is not limited to a specific example.

According to one or more embodiments, the light emitting elements LD patterned in the present step (or act) may be arranged in the matrix form configured in or along the row direction extending in the first arrangement direction ADR1 and the column direction extending in the second arrangement direction ADR2.

Figure 14:
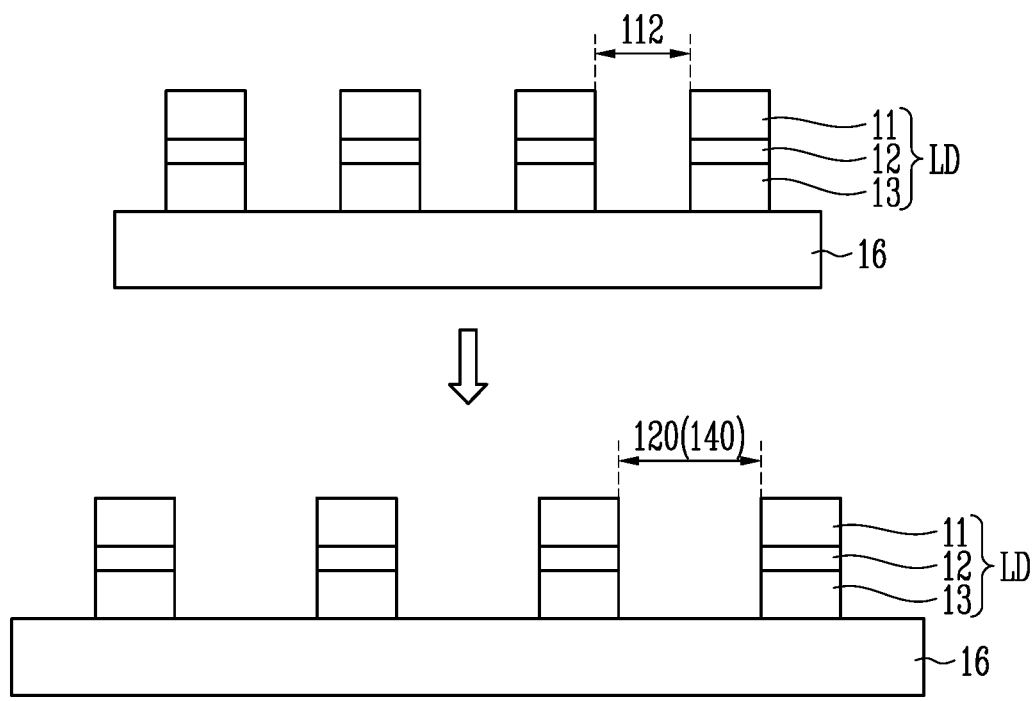

Referring to FIG. 14, the donor film 16 may be deformed. The area on a plane or in a plan view of the donor film 16 may be increased. The donor film 16 may be expanded in one direction. The donor film 16 may be expanded in an area direction.

Before the present step (or act) is performed, the light emitting elements LD adjacent to each other on the donor film 16 may be spaced from each other by an undeformed distance (or an unmodified distance) 112.

For example, the light emitting elements LD may be arranged in a matrix form on the donor film 16, and the light emitting elements LD adjacent to each other may be spaced from each other by the undeformed distance 112. Here, the undeformed distance 112 may refer to the shortest distance between the light emitting elements LD adjacent to each other on a plane or in a plan view. For example, the light emitting elements LD adjacent in the first arrangement direction ADR1 or the second arrangement direction ADR2 may be spaced from each other by the undeformed distance 112.

According to one or more embodiments, in the present step (or act), the donor film 16 may be evenly expanded radially. In the present step (or act), a length (or area) of the donor film 16 may be determined, and thus the separation distance between the light emitting elements LD may be increased. According to an example, the donor film 16 may be physically extended or expanded, but any suitable method may be applied, and the donor film 16 is not limited to a specific example.

According to an example, the present step (or act) may be performed, and thus the light emitting elements LD adjacent to each other in the first arrangement direction ADR1 may be spaced apart by the first arrangement distance 120 and the light emitting elements LD adjacent to each other in the second arrangement direction ADR2 may be spaced apart by the second arrangement distance 140.

According to one or more embodiments, a physical property suitable for the donor film 16 may be determined by a numerical relationship between the undeformed distance 112, the first arrangement distance 120, and/or the second arrangement distance 140.

For example, an extendable range of the donor film 16 in a length direction may be determined by the numerical relationship between the undeformed distance 112, the first arrangement distance 120, and/or the second arrangement distance 140.

Here, the expandable range of the donor film 16 may refer to a multiple within a limit in which the donor film 16 is not destroyed even though the donor film 16 is expanded on a plane or in a plan view. In other words, expansion of the donor film up to the expandable range may be non-destructive.

For example, when the expandable range of the donor film 16 is 2, a length of the donor film 16 may be expanded up to twice in one direction (e.g., the first arrangement direction ADR1), and when the length of the donor film 16 is expanded to twice or less, separate destruction may not occur.

According to one or more embodiments, the undeformed distance (or the unmodified distance) 112, the first arrangement distance 120, and/or the second arrangement distance 140, and the expandable range of the donor film 16 may satisfy Equation 4 below.

$$A \geq \frac{y}{v} \quad \text{Equation 4}$$

Here, y may be the separation distance between the light emitting elements LD, as described above, and may refer to the first arrangement distance 120 and/or the second arrangement distance 140. In addition, A may represent the expandable range of the donor film 16. v may be the distance between the light emitting elements LD before the donor film 16 is separately deformed, and may be the undeformed distance 112.

The present step (or act) may be performed, and thus the separation distance between the light emitting elements LD may be provided to satisfy the above-described Equation 1 (and/or Equation 2). That is, the separation distance between the light emitting elements LD may be determined according to Equation 1 (and/or Equation 2), and the separation distance between the light emitting elements LD may be appropriately or suitably adjusted in the present step (or act) so as to satisfy Equation 1 (and/or Equation 2). At this time, in order to adjust the separation distance between the light emitting elements LD, the physical property suitable for the donor film 16 may be calculated based on Equation 4. Accordingly, according to one or more embodiments, predictability of a process may be improved.

Figure 15:
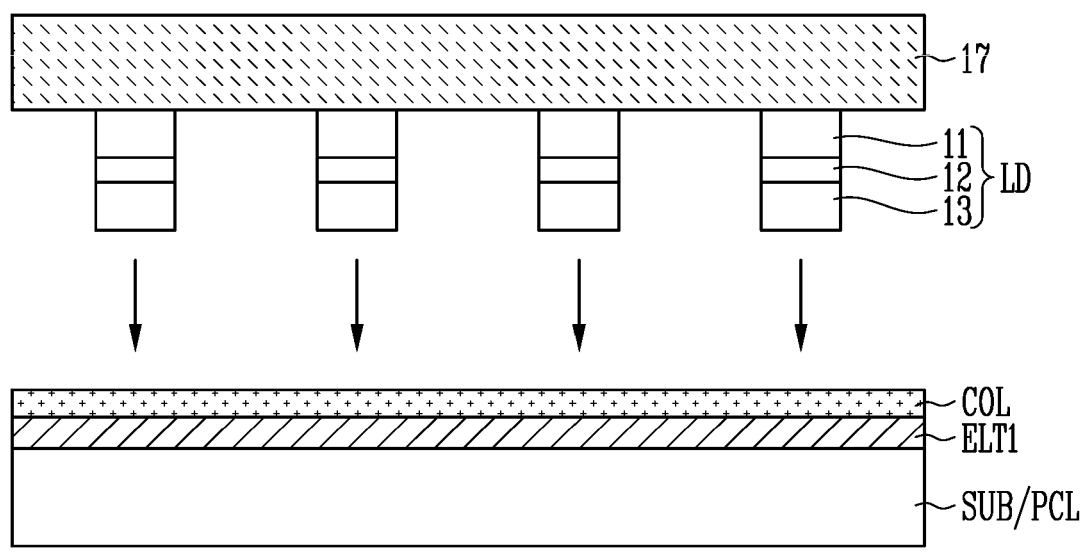
Figure 16:
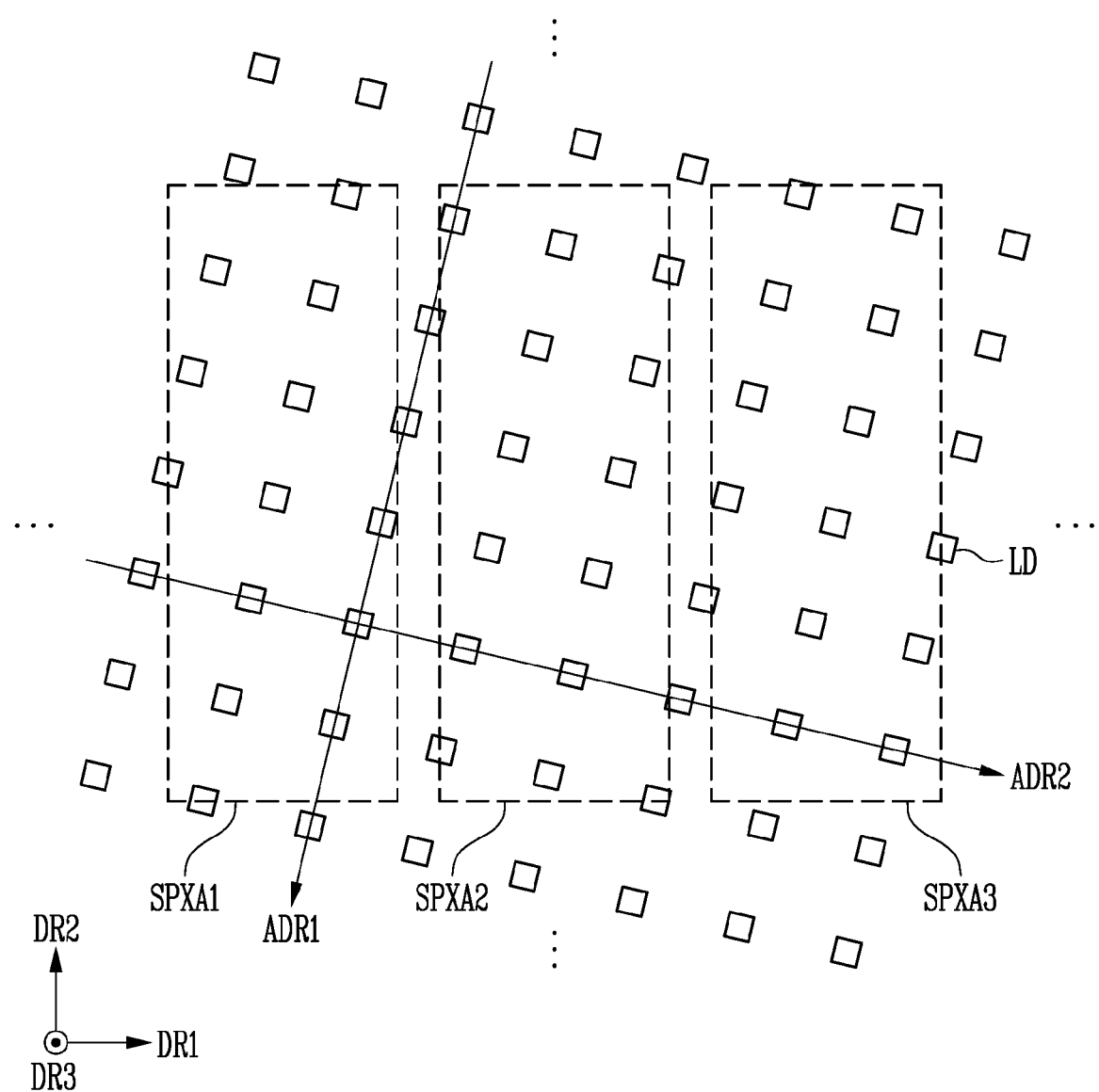
FIGS. 16 and 18 are plan views for each step (or act) of a method of manufacturing a display device according to one or more embodiments.

Referring to FIGS. 15 and 16, the light emitting element LD may be disposed on the substrate SUB and the pixel circuit part PCL by using a disposition member 17. The light emitting element LD may be combined to the connection electrode COL.

In the present step (or act), the disposition member 17 may be configured to combine the array of the light emitting elements LD arranged on the donor film 16 to one surface and deposit or transfer the light emitting elements LD onto the substrate SUB and the pixel circuit part PCL. The disposition member 17 may pick-up the individual light emitting elements LD concurrently (e.g., simultaneously) and may situate the individual light emitting elements LD on the substrate SUB and the pixel circuit part PCL. According to an example, the pick-up process of the disposition member 17 may be an elastomeric stamp method, an electromagnetic method, or a method using an adhesive member, but is not limited to a specific example.

In the present step (or act), the light emitting element LD and the disposition member 17 are combined so that the first semiconductor layer 11 faces the disposition member 17, and the light emitting element LD may be arranged so that the second semiconductor layer 13 faces the connection electrode COL.

Meanwhile, referring to FIG. 16 in the present step (or act), the light emitting elements LD may be disposed so that the first arrangement direction ADR1 and the second arrangement direction ADR2 deviate from a position at which the first to third sub pixel areas SPXA1, SPXA2, and SPXA3 are to be formed subsequently. Specifically, a positional relationship between the position of the first to third sub pixel areas SPXA1, SPXA2, and SPXA3 to be subsequently formed and a position of the first arrangement direction ADR1 and the second arrangement direction ADR2 may be adjusted, by adjusting an inclined angle of the donor film 16.

For example, the first direction DR1 may be a direction in which the first to third sub pixel areas SPXA1, SPXA2, and SPXA3 are spaced from each other, and the second direction DR2 may be a direction crossing the first direction DR1 and may be defined as a direction in which the first to third sub pixel areas SPXA1, SPXA2, and SPXA3 extend.

Here, when a process of disposing the light emitting element LD (e.g. see FIG. 15) of the donor film 16 is in progress, a pose of the donor film 16 for the substrate SUB and the pixel circuit part PCL may be adjusted. At this time, the first arrangement direction ADR1 may be provided to cross (or non-parallel) with the second direction DR2, by adjusting the pose of the donor film 16.

Figure 17:
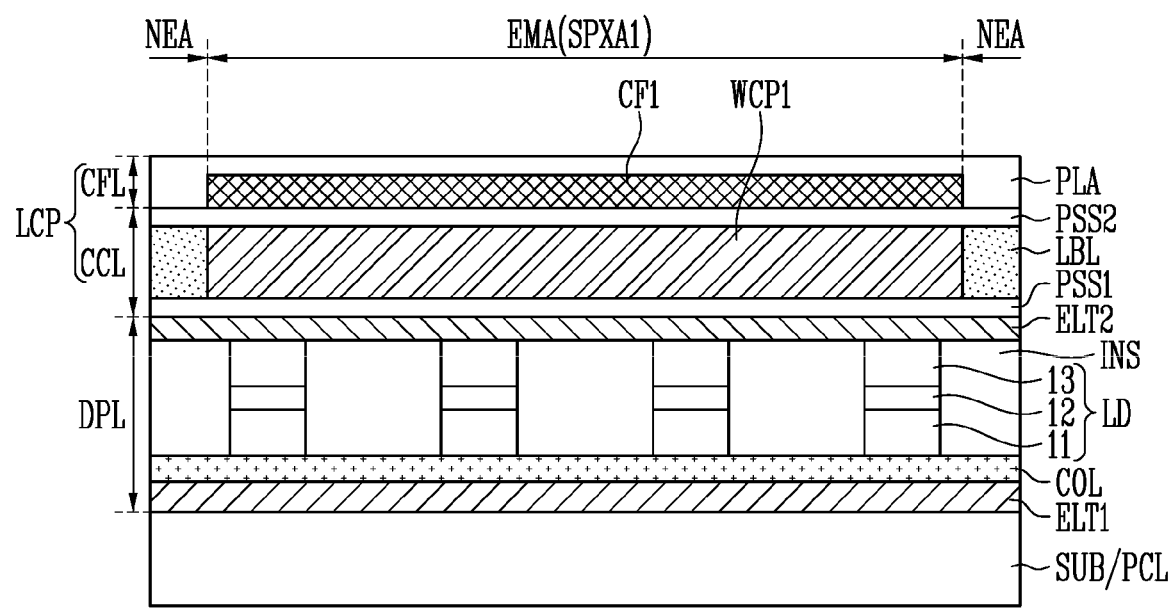
Figure 18:
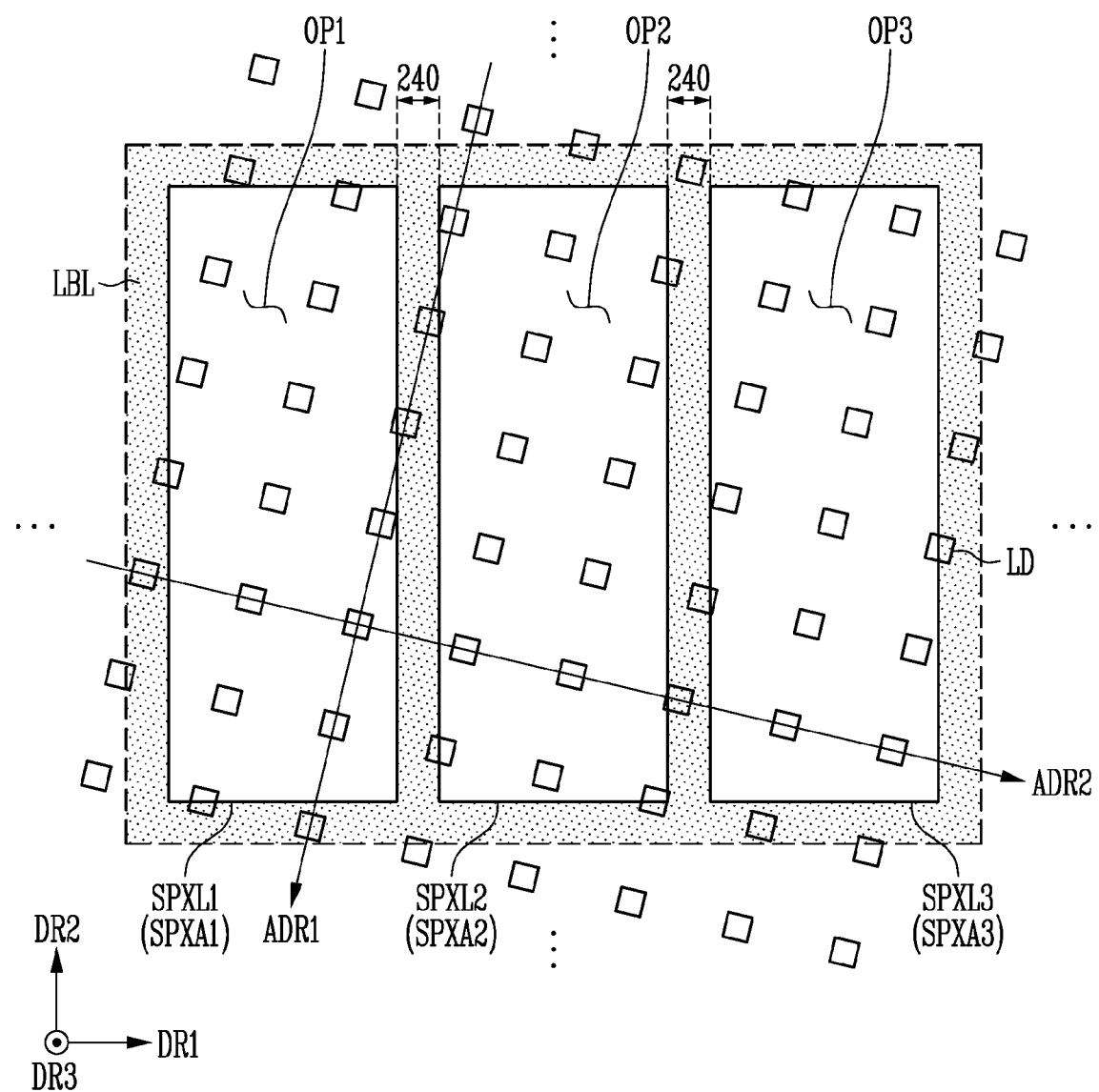

Referring to FIGS. 17 and 18, the insulating layer INS may be disposed on the connection electrode COL so that a region between the light emitting elements LD is filled. In addition, the second electrode ELT connected (e.g., electrically connected) to the light emitting element LD may be patterned, and then the light control part LCP may be disposed on the display element part DPL. In FIG. 17, for convenience of description, the first sub pixel SPXL1 among the sub pixels SPXL described above with reference to FIG. 5 is shown.

In the present step (or act), the color conversion part CCL may be disposed on the display element part DPL. At this time, the light blocking layer LBL may be formed on the display element part DPL to define the emission area EMA of the first to third sub pixels SPXL1, SPXL2, and SPXL3, for example, the first to third sub pixel areas SPXA1, SPXA2, and SPXA3.

Specifically, referring to FIG. 18, the light blocking layer LBL may be disposed so that the first to third openings OP1, OP2, and OP3 are formed. According to an example, after a base light blocking layer for forming the light blocking layer LBL is formed, an etching process may be performed on positions corresponding to the first to third openings OP1, OP2, and OP3.

In the present step (or act), the separation distance 240 in the first direction DR1 between the subsequently provided first to third sub pixels SPXL1, SPXL2, and SPXL3 may be controlled, by adjusting a separation distance between the first to third openings OP1, OP2, and OP3 of the light blocking layer LBL. For example, as described above, the separation distance 240 between the first to third sub pixels SPXL1, SPXL2, and SPXL3 may be provided to satisfy Equation 3.

In the present step (or act), the first arrangement direction ADR1 may be provided so that an extension direction (e.g., the second direction DR2) of the first to third sub pixels SPXL1, SPXL2, and SPXL3 has the gap angle $\theta$ having a range (e.g., a predetermined range), by adjusting the positions at which the first to third openings OP1, OP2, and OP3 of the light blocking layer LBL are formed.

Figure 19:
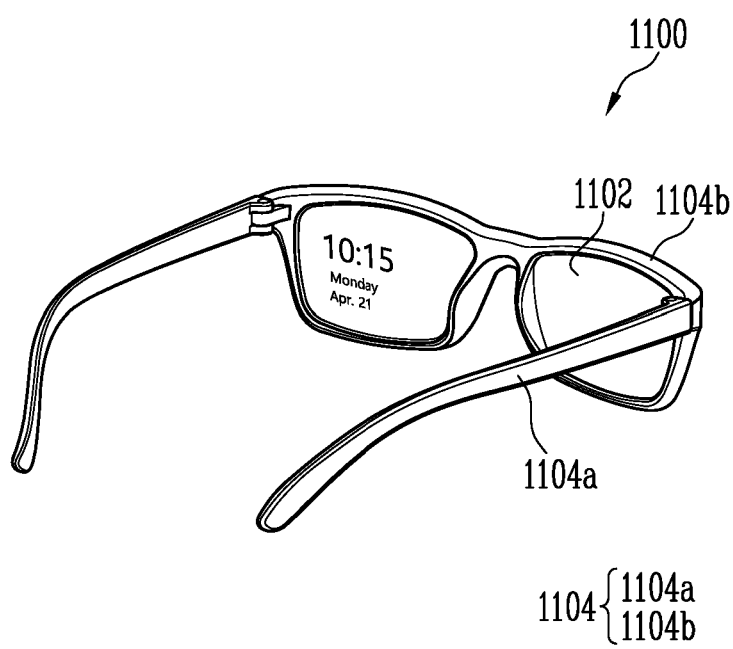
FIGS. 19 to 22 are diagrams illustrating an example to which a display device according to one or more embodiments is applied.
Figure 20:
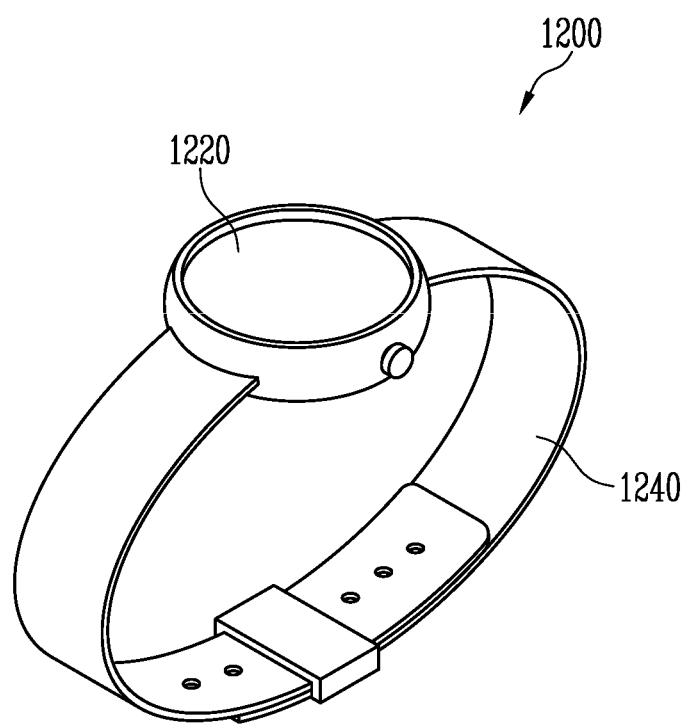
Figure 21:
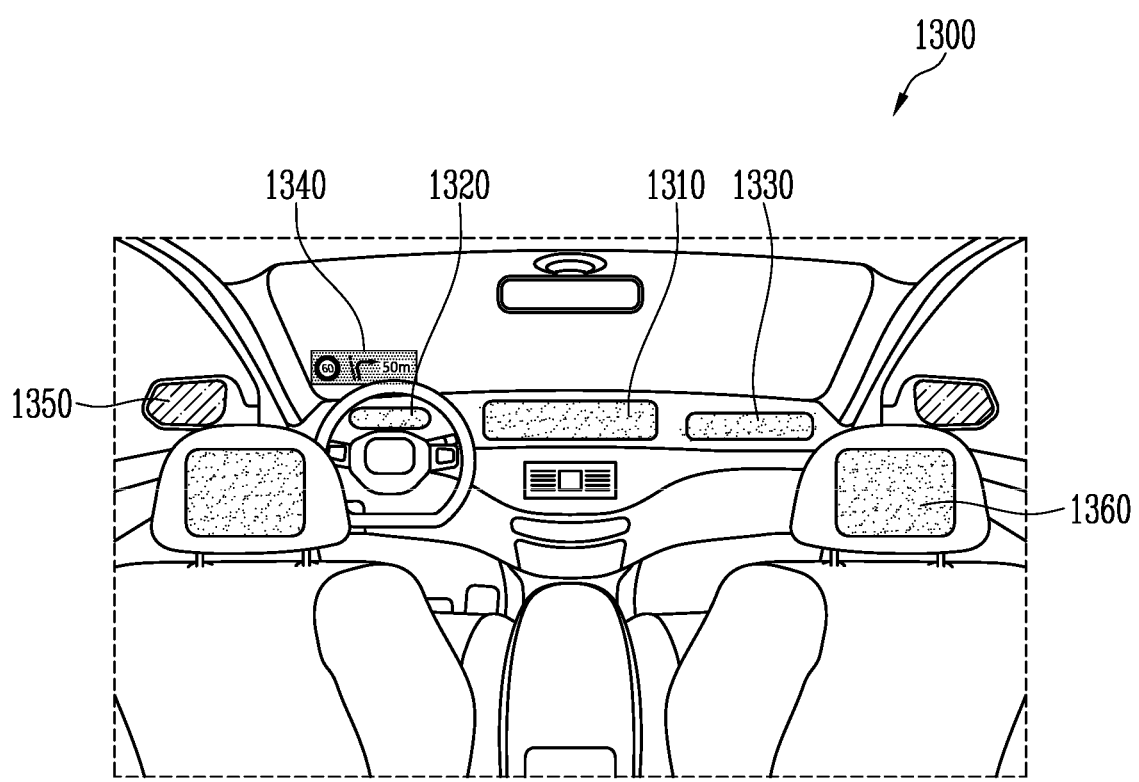

Hereinafter, an application field of the display device DD according to one or more embodiments is described with reference to FIGS. 19 to 21. FIGS. 19 to 22 are diagrams illustrating an example to which a display device according to one or more embodiments is applied. According to an example, the display device DD may be applied to a smart phone, a notebook computer, a tablet PC, a television, and/or the like, and may be applied to various other embodiments.

Referring to FIG. 19, a display device DD according to one or more embodiments may be applied to a smart glass 1100 including a frame 1104 and a lens portion 1102. The smart glass 1100 may be a wearable electronic device that may be worn on a face of a user, and may be a structure in which a portion of the frame 1104 is folded or unfolded. For example, the smart glass 1100 may be a wearable device for augmented reality (AR).

The frame 1104 may include a housing 1104*b* supporting the lens portion 1102 and a leg portion 1104*a* for wearing of the user. The leg portion 1104*a* may be connected to the housing 1104*b* by a hinge and may be folded or unfolded.

The frame 1104 may include a battery, a touch pad, a microphone, a camera, and/or the like therein. In addition, the frame 1104 may include a projector that outputs light, a processor that controls a light signal or the like, and/or the like therein.

The lens portion 1102 may be an optical member that transmits light and/or reflects light. The lens portion 1102 may include glass, transparent synthetic resin, or the like.

In addition, the lens portion 1102 may reflect an image by a light signal transmitted from the projector of the frame 1104 by a rear surface (e.g., a surface facing an eye of the user) of the lens portion 1102 to allow the eye of the user to recognize the image. For example, as shown in the drawing, the user may recognize information such as time and date displayed on the lens portion 1102. That is, the lens portion 1102 may be one type of a display device, and the display device DD according to the above-described embodiment may be applied to the lens portion 1102.

Referring to FIG. 20, a display device DD according to one or more embodiments may be applied to a smart watch 1200 including a display portion 1220 and a strap portion 1240.

The smart watch 1200 may be a wearable electronic device and may have a structure in which the strap portion

1240 is mounted on a wrist of a user. Here, the display device DD according to one or more embodiments may be applied to the display portion 1220, and thus image data including time information may be provided to the user.

Referring to FIG. 21, a display device DD according to one or more embodiments may be applied to an automotive display 1300. Here, the automotive display 1300 may refer to an electronic device provided inside and outside a vehicle to provide image data.

According to an example, the display device DD may be applied to at least one of an infotainment panel 1310, a cluster 1320, a co-driver display 1330, a head-up display 1340, a side mirror display 1350, and/or a rear seat display 1360, which are provided in the vehicle.

Figure 22:
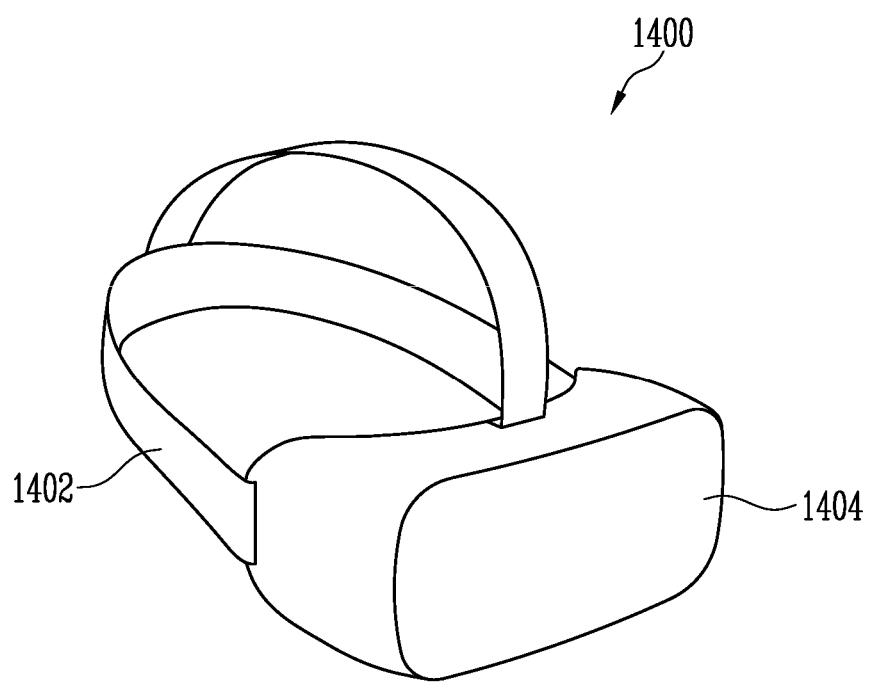

Referring to FIG. 22, a display device DD according to one or more embodiments may be applied to a head mounted display (HMD) 1400 including a head mounting band 1402 and a display storage case 1404. The HMD is a wearable electronic device that may be worn on a head of a user.

The head mounting band 1402 is a portion connected to the display storage case 1404 and may fix the display storage case 1404 at a desired position. In the drawing, the head mounting band 1402 is shown to be able to surround an upper surface and both side surfaces of the head of the user, but the present disclosure is not limited thereto. The head mounting band 1402 may be for fixing the HMD to the head of the user, and may be formed in an eyeglass frame form or a helmet form.

The display storage case 1404 may accommodate the display device DD and may include at least one lens. The at least one lens is a portion that provides an image to the user. For example, the display device DD according to one or more embodiments may be applied to a left-eye lens and a right-eye lens implemented in the display storage case 1404.

The application field of the display device DD according to one or more embodiments is not limited to the above-described example, and may be applied to various fields according to one or more embodiments.

The above description is merely an example of the technical spirit of the present disclosure, and those skilled in the art to which the present disclosure pertains will be able to make various modifications and variations without departing from the spirit and scope of the present disclosure. Therefore, the embodiments of the present disclosure described above may be implemented separately or in combination with each other.

Accordingly, while the present disclosure has been particularly shown and described with reference to embodiments thereof, it will be understood by those of ordinary skill in the art that various changes in form and details may be made therein without departing from the spirit and scope of the present disclosure as set forth in the following claims, and their equivalents.

What is claimed is:

1. A display device comprising:
a plurality of light emitting elements on a substrate and arranged in a matrix form along a first arrangement direction and a second arrangement direction crossing the first arrangement direction;
a first sub pixel area and a second sub pixel area each overlapping at least two of the plurality of light emitting elements in a plan view, spaced from each other in a first direction, and extending in a second direction crossing the first direction,
a light blocking layer on the substrate, the light blocking layer defining the first sub pixel area and the second sub pixel area, wherein the second direction and the first arrangement direction are non-parallel and are not orthogonal to each other; and
wherein the first arrangement direction is defined by a line between centers of more than two light emitting elements of the plurality of light emitting elements that are a shortest distance from each other among the plurality of light emitting elements.

2. The display device according to claim 1, wherein light of a first color is to be emitted in the first sub pixel area, and wherein light of a second color is to be emitted in the second sub pixel area.

3. The display device according to claim 1, wherein the second direction and the first arrangement direction form a gap angle having an acute angle.

4. The display device according to claim 3, wherein the gap angle is 5 degrees to 40 degrees.

5. The display device according to claim 1, further comprising:
a third sub pixel area spaced from the first sub pixel area and the second sub pixel area along the first direction,
wherein the first sub pixel area is at a side of the second sub pixel area, the third sub pixel area is at another side of the second sub pixel area,
wherein an end portion of the first sub pixel area and another end portion of the third sub pixel area are spaced from each other by a second length,
wherein the plurality of light emitting elements comprises a first light emitting element and a second light emitting element, the first light emitting element and the second light emitting element being adjacent to each other in the first arrangement direction and spaced from each other by a first arrangement distance,
wherein the second length and the first arrangement distance satisfy:

$$y \le \frac{\frac{x_2}{3}}{\sqrt{2}},$$

where $x_2$ is the second length, and $y$ is the first arrangement distance.

6. The display device according to claim 1, further comprising:
a light control part on the plurality of light emitting elements and configured to change a wavelength of light emitted from the light emitting elements; and
a third sub pixel area spaced from the first sub pixel area and the second sub pixel area along the first direction, and extending in the second direction,
wherein the light control part comprises:
a first wavelength conversion pattern overlapping the first sub pixel area;
a second wavelength conversion pattern overlapping the second sub pixel area; and
a light transmission pattern overlapping the third sub pixel area.

7. The display device according to claim 6, wherein at least a first portion of the plurality of light emitting elements overlaps the first sub pixel area, a second portion of the plurality of light emitting elements overlaps the second sub pixel area, and a third portion of the plurality of light emitting elements overlaps the third sub pixel area, and
wherein the plurality of light emitting elements are to emit light of a same color.

8. The display device according to claim 1, wherein a number per unit area of the plurality of light emitting elements on the substrate is uniform.

9. A display device comprising:
a plurality of light emitting elements on a substrate and arranged in a matrix form along a first arrangement direction and a second arrangement direction crossing the first arrangement direction; and
a first sub pixel area and a second sub pixel area each overlapping at least a portion of the plurality of light emitting elements, spaced from each other in a first direction, and extending in a second direction crossing the first direction,
wherein the second direction and the first arrangement direction are non-parallel to each other,
wherein the first sub pixel area includes a side parallel to the first direction and having a first length,
wherein the plurality of light emitting elements comprises a first light emitting element and a second light emitting element, the first light emitting element and the second light emitting element being adjacent to each other in the first arrangement direction and spaced from each other by a first arrangement distance, and
wherein the first length and the first arrangement distance satisfy:

$$y \leq \frac{x_1}{\sqrt{2}},$$

where $x_1$ is the first length, and y is the first arrangement distance.

10. The display device according to claim 9, wherein the first arrangement distance is a shortest distance between the first light emitting element and the second light emitting element.

11. A display device comprising:
a plurality of light emitting elements on a substrate and arranged in a matrix form along a first arrangement direction and a second arrangement direction crossing the first arrangement direction; and
a first sub pixel area and a second sub pixel area each overlapping at least a portion of the plurality of light emitting elements, spaced from each other in a first direction, and extending in a second direction crossing the first direction,
wherein the second direction and the first arrangement direction are non-parallel to each other
wherein the first sub pixel area and the second sub pixel area are spaced from each other by a separation distance,
wherein each of the plurality of light emitting elements has a bottom length, and
wherein the separation distance and the bottom length satisfy:

$$z \geq w * \sqrt{2}$$

where z is the separation distance, and w is the bottom length.

12. The display device according to claim 11, wherein a bottom surface of the plurality of light emitting elements has a circular shape, and
wherein the bottom length is a diameter of a circle.

13. The display device according to claim 11, wherein a bottom surface of the plurality of light emitting elements has a rectangular shape, and
wherein the bottom length is a diagonal length of a rectangle.

14. A method of manufacturing a display device, the method comprising:
providing a stack substrate;
forming a first semiconductor layer, an active layer, and a second semiconductor layer on the stack substrate;
providing a plurality of light emitting elements by etching the first semiconductor layer, the active layer, and the second semiconductor layer;
separating the stack substrate from the plurality of light emitting elements and combining the plurality of light emitting elements on a donor film;
disposing the plurality of light emitting elements on the donor film on a substrate; and
disposing a light blocking layer defining a first sub pixel area and a second sub pixel area on the plurality of light emitting elements so that the first sub pixel area and the second sub pixel area each overlapping at least two of the plurality of light emitting elements in a plan view,
wherein providing the plurality of light emitting elements comprises patterning the plurality of light emitting elements in a matrix form along a first arrangement direction and a second arrangement direction crossing the first arrangement direction,
wherein disposing the light blocking layer comprises forming the light blocking layer so that the first sub pixel area and the second sub pixel area are spaced from each other in a first direction and each of the first sub pixel area and the second sub pixel area extends in a second direction crossing the first direction,
wherein the first arrangement direction is defined by a line between centers of more than two light emitting elements of the plurality of light emitting elements that are a shortest distance from each other among the plurality of light emitting elements, and
wherein the second direction and the first arrangement direction are non-parallel and not orthogonal to each other.

15. The method according to claim 14, further comprising:
deforming the donor film so that a separation distance between the plurality of light emitting elements is increased.

16. The method according to claim 15, wherein before deforming the donor film is performed, the plurality of light emitting elements are spaced from each other at an undeformed distance, and
wherein, in deforming the donor film, the separation distance between the plurality of light emitting elements is increased, the plurality of light emitting elements adjacent in the first arrangement direction are separated by a first arrangement distance, and the plurality of light emitting elements adjacent in the second arrangement direction are separated by a second arrangement distance.

17. The method according to claim 16, wherein an expandable range is a multiple of a length within a limit that is non-destructive when the donor film is expanded in one direction,
wherein the expandable range of the donor film satisfies:

$$A \geq \frac{y}{v},$$

where A is the expandable range of the donor film, y is the first arrangement distance, and v is the undeformed distance.

18. The method according to claim 14, wherein the second direction and the first arrangement direction form a gap angle having an acute angle.

19. The method according to claim 14, further comprising:
    forming a first wavelength conversion pattern, a second wavelength conversion pattern, and a light transmission pattern at a same layer as the light blocking layer,
    wherein disposing the light blocking layer comprises forming the light blocking layer so that a third sub pixel area spaced from the first sub pixel area and the second sub pixel area in the first direction and extending in the second direction is defined,
    wherein the plurality of light emitting elements is to emit light of a third color,
    wherein the first wavelength conversion pattern is to change the light of the third color to light of a first color,
    wherein the second wavelength conversion pattern is to change the light of the third color to light of a second color,
    wherein the light transmission pattern is to transmit the light of the third color, and
    wherein the plurality of light emitting elements comprise first light emitting elements overlapping the first sub pixel area and the first wavelength conversion pattern, second light emitting elements overlapping the second sub pixel area and the second wavelength conversion pattern, and third light emitting elements overlapping the third sub pixel area and the light transmission pattern.

* * * * *